(12) United States Patent
Nakamura et al.

(10) Patent No.: US 8,822,396 B2
(45) Date of Patent: Sep. 2, 2014

(54) SOLUTION FOR REMOVING RESIDUE AFTER SEMICONDUCTOR DRY PROCESS AND METHOD OF REMOVING THE RESIDUE USING THE SAME

(75) Inventors: Shingo Nakamura, Settsu (JP); Takehiko Kezuka, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 2 days.

(21) Appl. No.: 12/671,419

(22) PCT Filed: Aug. 21, 2008

(86) PCT No.: PCT/JP2008/064910
§ 371 (c)(1),
(2), (4) Date: Jan. 29, 2010

(87) PCT Pub. No.: WO2009/025317
PCT Pub. Date: Feb. 26, 2009

(65) Prior Publication Data
US 2010/0203735 A1    Aug. 12, 2010

(30) Foreign Application Priority Data
Aug. 22, 2007   (JP) ................. 2007-216241

(51) Int. Cl.
| | | |
|---|---|---|
| *C11D 7/32* | (2006.01) | |
| *H01L 21/02* | (2006.01) | |
| *C11D 11/00* | (2006.01) | |
| *C11D 7/34* | (2006.01) | |

(52) U.S. Cl.
CPC .... *H01L 21/02068* (2013.01); *H01L 21/02063* (2013.01); *C11D 7/3281* (2013.01); *C11D 11/0047* (2013.01); *C11D 7/34* (2013.01)
USPC .......................................... 510/175; 510/176

(58) Field of Classification Search
CPC .......................... C11D 3/0073; C11D 11/0047
USPC ....................................................... 510/175
See application file for complete search history.

(56) References Cited

U.S. PATENT DOCUMENTS

| | | | |
|---|---|---|---|
| 6,140,027 A | 10/2000 | Baik et al. | |
| 6,831,048 B2 * | 12/2004 | Kezuka et al. | 510/175 |
| 6,897,150 B1 | 5/2005 | Aoki et al. | |
| 7,375,066 B2 * | 5/2008 | Kakizawa et al. | 510/175 |
| 7,947,637 B2 * | 5/2011 | Kneer | 510/175 |
| 7,960,328 B2 * | 6/2011 | Visintin et al. | 510/175 |
| 7,994,108 B2 * | 8/2011 | Minsek et al. | 510/175 |
| 2002/0013238 A1 | 1/2002 | Wojtczak et al. | |
| 2002/0034874 A1 | 3/2002 | Aoki | |
| 2003/0083214 A1 * | 5/2003 | Kakizawa et al. | 510/175 |
| 2003/0181344 A1 * | 9/2003 | Ikemoto et al. | 510/175 |
| 2004/0048761 A1 | 3/2004 | Ikemoto | |
| 2004/0180300 A1 * | 9/2004 | Minsek et al. | 430/329 |
| 2005/0003977 A1 * | 1/2005 | Itano et al. | 510/175 |
| 2005/0118821 A1 | 6/2005 | Minamihaba et al. | |
| 2005/0176606 A1 | 8/2005 | Konno et al. | |
| 2006/0063687 A1 * | 3/2006 | Minsek et al. | 510/175 |
| 2008/0004197 A1 * | 1/2008 | Kneer | 510/245 |
| 2008/0261847 A1 * | 10/2008 | Visintin et al. | 510/176 |
| 2009/0215659 A1 * | 8/2009 | Minsek et al. | 510/176 |
| 2009/0301996 A1 * | 12/2009 | Visintin et al. | 216/13 |
| 2011/0014793 A1 | 1/2011 | Muramatsu et al. | |

FOREIGN PATENT DOCUMENTS

| | | |
|---|---|---|
| CN | 1250226 A | 4/2000 |
| CN | 1258730 A | 7/2000 |
| CN | 1483093 A | 3/2004 |
| CN | 1626600 A | 6/2005 |
| CN | 1654617 A | 8/2005 |
| CN | 1706925 A | 12/2005 |
| JP | 10-012584 A | 1/1998 |
| JP | 2001-148385 A | 5/2001 |
| JP | 2002-299300 A | 10/2002 |
| JP | 2003-015321 A | 1/2003 |
| KR | 20040023517 A | 3/2004 |
| WO | 01/71789 A1 | 9/2001 |

* cited by examiner

*Primary Examiner* — Gregory Webb
(74) *Attorney, Agent, or Firm* — Sughrue Mion, PLLC

(57) ABSTRACT

A residue-removing solution for removing residues present on semiconductor substrates after dry etching and/or ashing, the residue-removing solution comprising a Cu surface protective agent including: at least one compound selected from compounds (1), (2) and (3) each having as a basic skeleton a five-membered or six-membered heteroatomic structure as defined herein; a compound capable of forming a complex or chelate with Cu (copper); and water. Further, the residue-removing solution has a pH of 4 to 9.

16 Claims, No Drawings

SOLUTION FOR REMOVING RESIDUE AFTER SEMICONDUCTOR DRY PROCESS AND METHOD OF REMOVING THE RESIDUE USING THE SAME

TECHNICAL FIELD

The present invention relates to a chemical solution for removing residues formed during dry etching and/or asking in the manufacturing process of semiconductor devices; and a method for manufacturing semiconductor devices, wherein such residues are removed using the chemical solution. More particularly, the invention relates to a residue-removing solution for use in manufacturing Cu/low-k multilayer interconnect structures.

BACKGROUND ART

Previously, the majority of semiconductor devices manufactured were those with an Al/SiO$_2$ multilayer interconnect structure, which uses Al, Al alloy or the like as an interconnect material, and an SiO$_2$ film as an interlayer dielectric. In recent years, in order to reduce the interconnect delay caused by the miniaturization of semiconductor devices, semiconductor devices with a Cu/low-k multilayer interconnect structure, which uses Cu (copper) with low resistance as an interconnect material and a low-k film (a low dielectric constant film) with low interconnect capacitance as an interlayer dielectric, have been manufactured in large quantities.

Cu/low-k multilayer interconnect structures are produced by a process called damascene. In dual damascene, which is one type of damascene process, trenches and via holes for an interconnect are first continuously formed by a dry process in an interlayer dielectric substrate made of a low-k film or the like.

A via-first process is one method for forming a dual damascene structure. In this process, via holes are first formed in an interlayer dielectric substrate by dry etching, and then filled with a filling material and planarized. Lithography is subsequently performed to form trenches, and dry etching follows. Ashing or a like process is subsequently performed to remove unwanted substances such as resist or filling material from the interlayer dielectric substrate having trenches and via holes.

Even after this process, however, unwanted substances (hereinafter referred to as "residues after a dry process") that cannot be completely removed remain on the substrate.

In a damascene structure, when trenches and via holes are filled with metals such as TaN as a barrier metal and Cu as an interconnect material, the presence of residues after a dry process leads to defective semiconductor devices. For this reason, these residues are removed using a residue-removing solution such as a polymer-removing solution.

After removing the residues after a dry process or Cu oxide film, the trenches or via holes are filled with an interconnect material such as Cu. Unwanted Cu portions are then removed by chemical-mechanical polishing (CMP) for planarization to form an interconnect structure. At this moment, metals, particles used for polishing, etc., metal ions, and the like remain on substrate surfaces. A post-CMP cleaning solution is used to remove these residues.

Cu surfaces after a dry process in the formation of a damascene or dual damascene structure have been damaged, and are thus structurally more fragile than the original. Therefore, even if corrosion of the Cu bulk due to the residue-removing process using a polymer-removing solution or the like is not observed, a close examination sometimes reveals Cu surface roughness or cracking along the grain boundary of the Cu surface. It is very likely that these minute changes on the Cu surface adversely affect the device performance.

A crack inhibitor is used in particular cases where cracking would easily occur; however, it may not necessarily provide a sufficient effect. Moreover, some sulfur-containing compounds effective for cracking prevention may cause Cu discoloration when added in large amounts, resulting in undesirable appearances. Further, in addition to cracking, minute Cu surface roughness may also occur.

Another problem is that the Cu surface damaged by the dry process can be readily oxidized. Therefore, when a wafer is exposed to air during transfer from one process to another after a chemical treatment using a polymer-removing solution or the like, an oxide film easily grows on the surface of the Cu metal interconnect. This Cu oxide film can also cause defects in semiconductor devices, often leading to defective devices. The Cu oxide film can be removed by argon sputtering, hydrogen reduction, and the like. However, argon sputtering often damages Cu surfaces, and hydrogen reduction can cause cracking along the grain boundaries of Cu surfaces. It is thus important to prevent the growth of a Cu oxide film.

Patent Document 1, for example, discloses using, in the post-CMP cleaning step, an anticorrosive such as benzotriazole at the same time as or subsequent to the removal of metal contaminants using a cleaning solution containing a carboxylic acid compound such as oxalic acid.

Benzotriazole, however, has the disadvantage of exhibiting only a small Cu antioxidant effect, and having large adverse effects on the environment due to its poor degradability. Moreover, although Patent Document 1 discloses indazole as an example of the anticorrosive, it does not disclose a specific chemical solution or treatment conditions. Further, Patent Document 1 discloses indazole as an example of four-membered heterocyclic compounds. This disclosure, however, is obviously technically incorrect.

Furthermore, Patent Document 1 teaches in paragraph the use of an aqueous solution containing 0.01 to 1% oxalic acid (a cleaning solution). However, the aqueous solution of oxalic acid at this concentration has a pH of 1.5 to 3, which is lower than the pKa of oxalic acid (3.82). The Cu antioxidant effect is therefore small, resulting in Cu surface cracking or roughness.

Accordingly, there is a demand for a residue-removing solution for use after a dry process that serves not only to prevent Cu surface oxidation, but also to prevent Cu surface cracking and roughness. No such residue-removing solutions, however, have yet been developed.

Patent Document 1: Japanese Unexamined Patent Publication No. 2001-148385

DISCLOSURE OF THE INVENTION

Problems to be Solved by the Invention

An object of the invention is to provide a residue-removing solution for use after a dry process that can prevent Cu surface cracking and roughness, and can simultaneously prevent Cu surface oxidation. This has heretofore been unattainable with prior art polymer-removing solutions. Another object of the invention is to provide a method for manufacturing semiconductor devices using the residue-removing solution.

Means for Solving the Problems

The inventor conducted extensive research in order to solve the above-described object. Consequently, they found that a chemical solution (a residue-removing solution) comprising a Cu surface protective agent comprising a group of compounds having predetermined structures and properties; a compound capable of forming a complex or chelate with Cu; and water; as well as having a pH of 4 to 9, is capable of preventing Cu surface cracking and roughness, and is also capable of preventing Cu surface oxidation. The inventor investigated further into this finding, and accomplished the invention.

Specifically, the invention provides a solution for removing residues present on semiconductor substrates after dry etching and/or ashing, and a method for manufacturing semiconductor devices using this residue-removing solution.

Item 1. A residue-removing solution for removing residues present on semiconductor substrates after dry etching and/or ashing, the residue-removing solution comprising:

a Cu surface protective agent comprising at least one compound selected from the group consisting of:

(1) a compound containing as a basic skeleton a five-membered heteroaromatic structure having a portion represented by the formula =N—NH—, excluding compounds having three consecutive N atoms, whose aqueous solution (10 ppm, 23° C.) has a pH of 7 or less;

(2) a compound containing as a basic skeleton a five-membered heterocyclic structure having a portion represented by the formula —N=C(SH)—X—, wherein X is NH, O, or S, whose aqueous solution (10 ppm, 23° C.) has a pH of 7 or less; and (3) a compound containing as a basic skeleton a six-membered heteroaromatic structure having at least one nitrogen atom (N), whose aqueous solution (10 ppm, 23° C.) has a pH of 7 or more;

a compound capable of forming a complex or chelate with Cu (copper); and water;

the residue-removing solution having a pH of 4 to 9.

Item 2. The residue-removing solution according to Item 1, wherein:

Compound (1) is selected from indazoles, pyrazoles, and 1,2,4-triazoles;

Compound (2) is selected from mercaptoimidazoles, mercaptooxazoles, mercaptothiazoles, mercaptothiazolines, mercaptobenzimidazoles, mercaptobenzoxazoles, and mercaptobenzothiazoles; and Compound (3) is selected from pyridines, pyrimidines, pyridazines, pyrazines, quinolines, quinazolines, quinoxalines, and cinnolines.

Item 3. The residue-removing solution according to Item 1 or 2, wherein:

Compound (1) is selected from indazole, 3-hydroxyindazole, 3-chloro-1H-indazole, 5-aminoindazole, 6-aminoindazole, 5-nitroindazole, 6-nitroindazole, 3-bromo-7-nitroindazole, 7-nitroindazole, indazole-3-carboxylic acid, 1-benzyl-1H-indazole-3-ol, pyrazole, 3,5-dimethylpyrazole, and 1,2,4-triazole;

Compound (2) is selected from 2-mercaptobenzimidazole, 2-mercaptoimidazole, 2-mercaptooxazole, 2-mercaptobenzoxazole, 2-mercaptothiazole, 2-mercaptobenzothiazole, and 2-thiazoline-2-thol; and Compound (3) is selected from methylpyridine, aminopyridine, 2,4-diaminopyrimidine, 2,4,6-triaminopyrimidine, pyridazine, 3-aminopyrazine-2-carboxylic acid, and 4-aminoquinoline.

Item 4. The residue-removing solution according to Item 1, 2, or 3, wherein the Cu surface protective agent comprises two or more compounds selected from the group consisting of Compounds (1) to (3).

Item 5. The residue-removing solution according to any one of Items 1 to 4, wherein the content of the Cu surface protective agent in the residue-removing solution is 0.1 to 4,000 ppm.

Item 6. The residue-removing solution according to any one of Items 1 to 5, wherein:

the content of the Cu surface protective agent comprising Compound (1) in the residue-removing solution is 0.1 to 3,000 ppm; and/or the content of the Cu surface protective agent comprising Compound (2) is 0.1 to 5 ppm; and/or the content of the Cu surface protective agent comprising Compound (3) is 10 to 1,000 ppm.

Item 7. The residue-removing solution according to any one of Items 1 to 6, wherein the compound capable of forming a complex or chelate with Cu is a keto acid, a keto acid salt, an aldehyde acid salt, a polycarboxylic acid salt, a strong acid capable of forming a complex or chelate with Cu, a neutral organic solvent having an oxygen atom capable of coordinating to Cu, and/or a monohydric alcohol with 4 or more carbon atoms.

Item 8. The residue-removing solution according to Item 7, wherein the compound capable of forming a complex or chelate with Cu is at least one compound selected from the group consisting of keto acids, keto acid salts, and aldehyde acid salts.

Item 9. The residue-removing solution according to Item 7, wherein the compound capable of forming a complex or chelate with Cu is a strong acid capable of forming a complex or chelate with Cu, and a polycarboxylic acid salt.

Item 10. The residue-removing solution according to Item 7, wherein the compound capable of forming a complex or chelate with Cu is a neutral organic compound having two or more oxygen atoms capable of coordinating to Cu and/or a monohydric alcohol with 4 or more carbon atoms.

Item 11. The residue-removing solution according to Item 7, wherein the compound capable of forming a complex or chelate with Cu is a perchlorate.

Item 12. The residue-removing solution according to any one of Items 1 to 11, further comprising a fluorine compound.

Item 13. The residue-removing solution according to any one of Items 1 to 12, further comprising a surfactant.

Item 14. A method for removing residues present on semiconductor substrates after dry etching and/or ashing, the method comprising bringing a semiconductor substrate after dry etching and/or ashing into contact with the residue-removing solution of any one of Items 1 to 13.

Item 15. The method according to Item 14, wherein the semiconductor substrate has Cu as an interconnect material, and a low-k film as an interlayer dielectric material.

Item 16. A method for manufacturing semiconductor devices comprising the steps of:

(1) subjecting a semiconductor substrate having Cu as an interconnect material, and a low-k film as an interlayer dielectric material, to dry etching and/or ashing; and (2) bringing the semiconductor substrate processed in Step (1) into contact with the residue-removing solution of any one of Items 1 to 13.

Item 17. The method according to Item 16, further comprising the step of (3) heating the semiconductor substrate processed in Step (2) to 180° C. or more in an inert gas or vacuum.

Effects of the Invention

By using the residue-removing solution of the invention for use after a dry process, it is possible to remove residues on semiconductor substrates, and also prevent minute cracking of Cu surfaces and Cu surface roughness that can easily occur due to damage after the dry process, and prevent Cu surface oxidation that can easily occur due to damage after the dry process. This has heretofore been unattainable with prior art polymer-removing solutions.

Previously, the range of chemical compositions for preventing all of Cu surface cracking, roughness, and oxidation was sometimes limited. However, a wide range of chemical compositions can be selected for the residue-removing solution of the invention, enabling the use of a wide range of chemical solutions, as well as reduced manufacturing costs.

Moreover, Cu discoloration due to the Cu surface protective agent added does not occur, thus obviating the problem of a defective appearance. Further, the Cu surface protective agent can be easily degraded, thus having little effect on the environment.

Accordingly, by comprising the predetermined Cu surface protective agent, the residue-removing solution of the invention can contribute to the manufacture of semiconductor devices in an improved yield.

BEST MODE FOR CARRYING OUT THE INVENTION

The invention will be described in detail below.

I. Residue-Removing Solution for Use After a Semiconductor Dry Process

The residue-removing solution of the invention for removing residues present on semiconductor substrates after dry etching and/or asking comprises:

a Cu surface protective agent comprising at least one compound selected from the group consisting of:

(1) a compound containing as a basic skeleton a five-membered heteroaromatic structure having a portion represented by the formula =N—NH—, excluding compounds having three consecutive N atoms, whose aqueous solution (10 ppm, 23° C.) has a pH of 7 or less;

(2) a compound containing as a basic skeleton a five-membered heterocyclic structure having a portion represented by the formula —N=C(SH)—X—, wherein X is NH, O, or S, whose aqueous solution (10 ppm, 23° C.) has a pH of 7 or less; and (3) a compound containing as a basic skeleton a six-membered heteroaromatic structure having at least one nitrogen atom (N), whose aqueous solution has a pH of 7 or more;

a compound capable of forming a complex or chelate with Cu; and water;

the residue-removing solution having a pH of 4 to 9.

The residue-removing solution of the invention for use after a dry process comprising a Cu surface protective agent has a pH of 4 to 9, preferably 4 to 8, and more preferably 5 to 7. At a pH of less than 4, the effect of preventing Cu surface cracking, roughness, and oxidation will be small; and at a pH of 4 or more, the effect will be greater. Moreover, where porous low-k is used as the dielectric film, the surface may deteriorate at a pH of less than 4; therefore, a pH of 4 or more is preferable. At a pH of more than 9, although the effect of the Cu surface protective agent can be obtained, the effect of removing the native oxide film of Cu and residues after a dry process will be small, and the low-k film will be damaged, e.g., the surface will deteriorate.

The residue-removing solution can further optionally contain a fluorine compound, a perchlorate, a surfactant, and the like, to exhibit additional superior function(s).

Cu Surface Protective Agent

The Cu surface protective agent used in the residue-removing solution of the invention comprises at least one compound selected from the group consisting of:

(1) a compound containing as a basic skeleton a five-membered heteroaromatic structure having a portion represented by the formula =N—NH—, excluding compounds having three consecutive N atoms, whose aqueous solution (concentration: 10 ppm, 23° C.) has a pH of 7 or less;

(2) a compound containing as a basic skeleton a five-membered heterocyclic structure having a portion represented by the formula —N=C(SH)—X—, wherein X is NH, O, or S, whose aqueous solution (concentration: 10 ppm, 23° C.) has a pH of 7 or less; and (3) a compound containing as a basic skeleton a six-membered heteroaromatic structure having at least one nitrogen atom (N), whose aqueous solution (concentration: 10 ppm, 23° C.) has a pH of 7 or more.

The pH of the aqueous solutions of both of Compounds (1) to (2) (10 ppm, 23° C.) is set to 7 or less, so that protons are difficult to attach to the lone pairs of the nitrogen atoms in these molecules. The pH is preferably 3 to 7, and more preferably 4 to 6.5. The pH of the aqueous solution of Compound (3) (10 ppm, 23° C.) is set to 7 or more, so that a proton is easily attached to the lone pair of the nitrogen atom in the molecule. The pH is preferably 7 to 11, and more preferably 8 to 10.

Compound (1) may be any compound containing as a basic skeleton a five-membered heteroaromatic structure having a portion represented by the formula =N—NH—, excluding compounds having three consecutive N atoms. Compound (1) may also be a compound having another aromatic ring (e.g., a benzene ring) fused to the basic skeleton. Compound (1) is defined as a so-called π-electron excessive N-containing heteroaromatic compound. The compound may have substituent(s) on its ring. For example, the compound may have 1 to 3 substituents such as alkyl groups, and preferably $C_{1-3}$ alkyl groups, hydroxy groups, amino groups, nitro groups, halogen atoms, e.g., fluorine, chlorine, and bromine atoms, and carboxy groups.

Specific examples of Compound (1) include indazoles, pyrazoles, and 1,2,4-triazoles. More specifically, examples of indazoles include indazole, 3-hydroxyindazole, 3-chloro-1H-indazole, 5-aminoindazole, 6-aminoindazole, 5-nitroindazole, 6-nitroindazole, 3-bromo-7-nitroindazole, 7-nitroindazole, indazole-3-carboxylic acid, and 1-benzyl-1H-indazole-3-ol; examples of pyrazoles include pyrazole and 3,5-dimethylpyrazole; and examples of 1,2,4-triazoles include 1,2,4-triazole. Preferable among the above are indazole, 3-chloro-1H-indazole, indazole-3-carboxylic acid, and 5-nitroindazole. Most preferable are indazole, 5-nitroindazole, and indazole-3-carboxylic acid.

The Cu surface protective agent comprising Compound (1) has an excellent property to prevent all of Cu surface oxidation, cracking, and roughness, and is therefore the most suitable as a Cu surface protective agent contained in the residue-removing solution.

Compound (2) may be any compound containing as a basic skeleton a five-membered heterocyclic structure having a portion represented by the formula —N=C(SH)—X—, wherein X is NH, O, or S. Compound (2) may also be a compound having another aromatic ring (e.g., a benzene ring) fused to the basic skeleton. Compound (2) is defined as a so-called π-electron excessive N-, O-, or S-containing heteroaromatic compound. The compound may have substituent(s) on its ring. For example, the compound may have 1 to 3 substituents such as alkyl groups, and preferably $C_{1-3}$ alkyl groups, hydroxy groups, amino groups, nitro groups, halogen atoms, e.g., fluorine, chlorine, and bromine atoms, and carboxy groups.

Specific examples of Compound (2) include mercaptoimidazoles, mercaptooxazoles, mercaptothiazoles, mercaptothiazolines, mercaptobenzimidazoles, mercaptobenzoxazoles, and mercaptobenzothiazoles. More specific examples include 2-mercaptobenzimidazole, 2-mercaptoimidazole, 2-mercaptooxazole, 2-mercaptobenzoxazole, 2-mercaptothiazole, 2-mercaptobenzothiazole, and 2-thiazoline-2-thiol. Preferable among the above are 2-mercaptoimidazole, 2-mercaptobenzoxazole, 2-mercaptobenzothiazole, and 2-thiazoline-2-thiol. The most preferable are 2-mercaptobenzoxazole, 2-mercaptobenzothiazole, and 2-thiazoline-2-thiol.

The Cu surface protective agent comprising Compound (2) has an excellent property to mainly prevent Cu surface oxidation and roughness.

Compound (3) may be any compound containing as a basic skeleton a six-membered heteroaromatic structure having at least one nitrogen atom (N). Compound (3) may also be a compound having another aromatic ring (e.g., a benzene ring) fused to the basic skeleton. Compound (3) is defined as a so-called π-electron deficient N-containing heteroaromatic compound. The compound may have substituent(s) on its ring. For example, the compound may have 1 to 3 substituents such as alkyl groups, and preferably $C_{1-3}$ alkyl groups, hydroxy groups, amino groups, nitro groups, halogen atoms, e.g., fluorine, chlorine, and bromine atoms, and carboxy groups.

Specific examples of Compound (3) include pyridines, pyrimidines, pyridazines, pyrazines, quinolines, quinazolines, quinoxalines, and cinnolines. More specific examples include methylpyridine, aminopyridine, 2,4-diaminopyrimidine, 2,4,6-triaminopyrimidine, pyridazine, 3-aminopyrazine-2-carboxylic acid, and 4-aminoquinoline. Preferable among the above are 2,4-diaminopyrimidine and 2,4,6-triaminopyrimidine. The most preferable is 2,4,6-triaminopyrimidine.

The Cu surface protective agent comprising Compound (3) has an excellent property to mainly prevent Cu surface roughness.

Cu surface cracking, roughness, and oxidation individually are believed to occur due to different reasons. Therefore, these problems cannot always be prevented using only one Cu surface protective agent. In order to enhance the effect of preventing these problems, a mixture of two or more of the above-mentioned compounds is preferably used according to the Cu surface condition.

The Cu surface protective agent is expensive, and the addition of an excess amount of the Cu surface protective agent will reduce the ability to remove residues after a dry process. Therefore, a smaller amount of the Cu surface protective agent is better, as long as it is within a range of concentrations such that the effect can be obtained and continued. In order to achieve a continued effect, the amount of the Cu surface protective agent in the residue-removing solution is about 0.1 to about 4,000 ppm, and preferably about 0.25 to about 2,000 ppm.

The concentration of the Cu surface protective agent comprising Compound (1) is typically about 0.1 to about 3,000 ppm. Where the residue-removing solution does not contain a substance having a carboxy group, or where the residue-removing solution contains a substance having a carboxy group, and has a pH equal to or more than the pKa of the substance having a carboxy group, the concentration of the Cu surface protective agent comprising Compound (1) is typically 0.1 to 100 ppm, preferably 0.1 to 10 ppm, and more preferably 0.1 to 1 ppm.

Where the residue-removing solution contains a substance having a carboxy group, and has a pH less than the pKa of the substance having a carboxy group, the concentration of the Cu surface protective agent comprising Compound (1) is typically 1 to 3,000 ppm, preferably 5 to 2,000 ppm, and more preferably 100 to 1,000 ppm.

Compound (1) is generally only slightly soluble in water, so that the concentration of Compound (1) used is often limited because of its solubility. Moreover, the addition of a large amount of Compound (1) may reduce the ability to remove residues after a dry process. In order to increase the solubility of the Cu surface protective agent, and prevent the ability to remove residues from decreasing due to the addition of the Cu surface protective agent, it is preferable that an organic solvent be added as required to the residue-removing solution in an amount of 10 wt % or more, and preferably about 10 to about 50 wt %. The residue-removing solution typically contains an organic solvent where it contains a substance having a carboxy group, has a pH less than the pKa of the substance having a carboxy group, and has a concentration of the Cu surface protective agent of 100 ppm or more.

The concentration of the Cu surface protective agent comprising Compound (2) is 0.1 to 50 ppm, preferably 0.1 to 5 ppm, and more preferably 0.1 to 1 ppm.

The concentration of the Cu surface protective agent comprising Compound (3) is 10 to 1,000 ppm, preferably 50 to 500 ppm, and more preferably 100 to 300 ppm.

In the case of a mixture of any of Compounds (1) to (3), the content (concentration) of at least two of these compounds is preferably 0.2 to 3,000 ppm.

Compound Capable of Forming a Complex or Chelate with Cu

The composition of the residue-removing solution for use after a dry process containing the Cu surface protective agent is not limited as long as it can remove residues containing Cu, Si, organic substances, and the like. However, the residue-removing solution must include a compound capable of forming a complex or chelate with Cu, in order to remove Cu residue, which is a principal component of the residues.

Examples of the compound capable of forming a complex or chelate with Cu include keto acids, keto acid salts, aldehyde acid salts, polycarboxylic acid salts, strong acids capable of forming a complex or chelate with Cu, neutral organic solvents having an oxygen atom capable of coordinating to Cu, and monohydric alcohols with 4 or more carbon atoms. Any combination of these compounds is possible as long as the pH of the residue-removing solution can be adjusted to 4 to 9.

Examples of keto acids include pyruvic acid, levulinic acid, 5-aminolevulinic acid, α-ketoglutaric acid, and acetonedicarboxylic acid.

Examples of keto acid salts include salts formed from the above-mentioned keto acids such as pyruvic acid, levulinic acid, 5-aminolevulinic acid, α-ketoglutaric acid, and acetonedicarboxylic acid; and bases such as ammonia, hydroxylamine, primary, secondary, and tertiary amines, quaternary ammonium, and polyamines. Preferable among these salts is at least one salt selected from the group consisting of salts formed from pyruvic acid and levulinic acid, with ammonia, methylamine, ethylamine, propylamine, butylamine, dimethylamine, diethylamine, trimethylamine, triethylamine, propanediamine, triethylenetetramine, tetramethylammonium hydroxide, and choline. A more preferable salt is diethylamine, tetramethylammonium hydroxide, or choline salt of pyruvic acid; or methylamine, ethylamine, or diethylamine salt of levulinic acid.

As an example of aldehyde acid salts is mentioned at least one salt selected from the group consisting of salts formed from glyoxylic acid with ammonia, hydroxylamine, primary, secondary, and tertiary amines, quaternary ammonium, and polyamines. Preferable among these salts is butylamine, diethylamine, tetramethylammonium hydroxide, or choline salt of glyoxylic acid.

A keto acid salt or aldehyde acid salt may be used in the form of crystals, or in the form of an aqueous solution produced by mixing each acid and a base in water, and neutralizing the mixture.

The concentration of at least one component selected from the group consisting of keto acids, keto acid salts, and aldehyde acid salts in the residue-removing solution can be suitably selected according to the amount or nature of the residues to be removed after a dry process.

The amount (concentration) of the at least one component selected from the group consisting of keto acids, keto acid salts, and aldehyde acid salts in the residue-removing solution may typically be about 0.1 to about 35 wt %.

More specifically, the amount (concentration) of the keto acid in the residue-removing solution may typically be 0.5 to 10 wt %, preferably 1 to 5 wt %, and more preferably 1 to 3 wt %. The lower the concentration of the keto acid, the smaller the residue-removing effect; while the higher the concentration, the greater the removal effect and the longer the lifetime of the chemical solution. The concentration of the keto acid, however, is preferably 10 wt % or less, in consideration of cost-effectiveness and the tendency of an acid to cause Cu surface cracking.

The amount (concentration) of the aldehyde acid salt and/or the keto acid salt in the residue-removing solution may typically be 0.1 to 35 wt %, preferably 0.3 to 15 wt %, and more preferably 0.5 to 10 wt %. The lower the concentration of these acids, the smaller the residue-removing effect. The effect is particularly small when the concentration is less than 0.1 wt %. The higher the concentration, the greater the effect of removal and the longer the lifetime of the chemical solution. However, the concentration is preferably 35 wt % or less, in consideration of cost-effectiveness.

As an example of polycarboxylic acid salts is mentioned at least one salt selected from the group consisting of salts formed from polycarboxylic acids such as oxalic acid, malonic acid, succinic acid, glutaric acid, adipic acid, malic acid, tartaric acid, diammonium hydrogen citrate, ammonium dihydrogen citrate, and citric acid; with bases such as ammonia, hydroxylamine, alkanolamines, primary, secondary, and tertiary amines, quaternary ammonium, and polyamines. Preferable examples of these salts include salts formed from polycarboxylic acids such as oxalic acid, malonic acid, diammonium hydrogen citrate, ammonium dihydrogen citrate, and citric acid, with bases such as ammonia, primary, secondary, and tertiary amines, quaternary ammonium, alkanolamines, and polyamines.

More specific examples include salts of polycarboxylic acids such as oxalic acid, malonic acid, diammonium hydrogen citrate, ammonium dihydrogen citrate, and citric acid, with ammonium, methylamine, ethylamine, propylamine, butylamine, dimethylamine, diethylamine, trimethylamine, triethylamine, ethanolamine, diethanolamine, triethanolamine, diisopropanolamine, tri-iso-propanolamine, isopropanolamine, n-propanolamine, N,N-dimethylethanolamine, N-methylethanolamine, N-methyldiethanolamine, N-acetylethanolamine, N-ethylethanolamine, propanediamine, triethylenetetramine, tetramethylammonium hydroxide, choline, and the like.

Most preferable of the above are ammonium and methylamine salts of oxalic acid; ammonium, methylamine, ethylamine, tetramethylammonium hydroxide, and choline salts of malonic acid; methylamine, ethylamine, tetramethylammonium hydroxide, and choline salts of diammonium hydrogen citrate; methylamine, ethylamine, tetramethylammonium hydroxide, and choline salts of ammonium dihydrogen citrate; and ammonium, methylamine, ethylamine, tetramethylammonium hydroxide, and choline salts of citric acid.

These polycarboxylic acid salts may be used in the form of crystals, or in the form of aqueous solutions produced by mixing these acids and bases in water, and neutralizing the mixtures. The amount (concentration) of the polycarboxylic acid salt in the residue-removing solution is typically 0.1 to 20 wt %, preferably 0.5 to 10 wt %, and more preferably 1 to 5 wt %.

The neutral organic compound containing an oxygen atom capable of coordinating to Cu may be any neutral organic compound having an oxygen coordination site for Cu. The term "neutral organic compound" denotes solvents other than protogenic (acidic) solvents and protophilic (basic) solvents. Examples of such neutral organic compounds include polycarbonyls, keto alcohols, hydroxy esters, diesters, ketoesters, lactones, carbonates, polyethers, glycols, alkylene glycol monoethers, alkylene glycol diesters, alkylene glycol ether esters, polyalkyleneglycols, polyalkylene glycol monoethers, polyalkylene glycol diesters, and polyalkylene glycol ether esters.

Examples of polycarbonyls include dialdehydes such as glyoxal; diketones such as 2,3-butanedione, 2,4-pentanedione (acetylacetone), 2,3-pentanedione, 1,2-cyclohexanedione, and 3,4-hexanedione; and keto aldehydes such as methylglyoxal. Among the above, 2,3-butanedione is preferable.

Examples of keto alcohols include acetoin, diacetone alcohol, and acetonyl alcohol. Among the above, acetoin is preferable.

Examples of hydroxy esters include methyl lactate, ethyl lactate, butyl lactate, methyl glycolate, ethyl glycolate, dimethyl tartarate, diethyl tartrate, and methyl glycolate. Among the above, ethyl lactate and methyl glycolate are preferable.

Examples of diesters include dimethyl oxalate, diethyl oxalate, dimethyl malonate, diethyl malonate, dimethyl succinate, diethyl succinate, dimethyl glutarate, diethyl glutarate, dimethyl adipate, and dimethyl maleate. Among the above, dimethyl oxalate, diethyl oxalate, dimethyl malonate, and diethyl malonate are preferable.

Examples of ketoesters include methyl acetoacetate, ethyl acetoacetate, methyl pyruvate, and butyl levulinate. Among the above, methyl acetoacetate and ethyl acetoacetate are preferable.

Examples of lactones include γ-butyrolactone, glucono-δ-lactone, and δ-valerolactone. Among the above, γ-butyrolactone is preferable.

Examples of carbonates include propylene carbonate, ethylene carbonate, dimethyl carbonate, and diethyl carbonate. Among the above, propylene carbonate is preferable.

Examples of polyethers include glycol dialkyl ethers such as dimethoxymethane, dimethoxyethane, diethoxymethane, ethylene glycol methyl ethyl ether, dimethoxyethane, diethoxymethane, diethoxyethane, ethylene glycol di-n-butyl ether, and dimethoxypropane; polyalkylene glycol dialkyl ethers such as diethylene glycol dimethyl ether, diethylene glycol methyl ethyl ether, diethylene glycol diethyl ether, diethylene glycol di-n-butyl ether, triethylene glycol dimethyl ether, triethylene glycol ethyl methyl ether, triethylene glycol diethyl ether, tetraethylene glycol dimethyl ether, tetraethylene glycol diethyl ether, and polyethylene glycol dimethyl ether. Preferable among the above are dimethoxyethane, diethylene glycol dimethyl ether, diethylene glycol diethyl ether, triethylene glycol dimethyl ether, and tetraethylene glycol dimethyl ether.

Examples of glycols include ethylene glycol, 1,3-propanediol, 1,2-propanediol, glycerol, 1,2-cyclohexanediol, 2,2-dimethyl-1,3-propanediol, 2,5-dimethyl-2,5-hexanediol, 2,3-naphthalenediol, 1,2-butanediol, 1,3-butanediol, 1,4-butanediol, 2-butyne-1,4-diol, 2-butene-1,4-diol, DL-1,2-hexanediol, 2,5-hexanediol, 1,2-benzenediol, 2,4-pentanediol, and 2-methyl-2,4-pentanediol. Among the above, ethylene glycol, 1,3-propanediol, and 1,2-propanediol are preferable.

Examples of alkylene glycol monoethers include ethylene glycol monomethyl ether, ethylene glycol monoethyl ether, ethylene glycol mono-n-butyl ether, and ethylene glycol monophenyl ether. Among the above, ethylene glycol monomethyl ether and ethylene glycol monoethyl ether are preferable.

Examples of alkylene glycol diesters include ethylene glycol diacetate and propylene glycol diacetate. Among the above, ethylene glycol diacetate is preferable.

Examples of alkylene glycol ether esters include ethylene glycol monomethyl ether acetate, ethylene glycol monoethyl ether acetate, propylene glycol monomethyl ether acetate, ethylene glycol mono-n-butyl ether acetate, propylene glycol monomethyl ether acetate, propylene glycol monoethyl ether acetate, and ethylene glycol mono-n-butyl ether acetate. Among the above, ethylene glycol monomethyl ether acetate and ethylene glycol monoethyl ether acetate are preferable.

Examples of polyalkyleneglycols include diethylene glycol, triethylene glycol, tetraethylene glycol, polyethylene glycol, dipropylene glycol, poly(propylene glycol), and glycerol. Among the above, diethylene glycol and triethylene glycol are preferable.

Examples of polyalkylene glycol monoethers include diethylene glycol monomethyl ether, diethylene glycol monoethyl ether, diethylene glycol monoisobutyl ether, diethylene glycol mono-n-butyl ether, diethylene glycol monobenzyl ether, diethylene glycol monohexyl ether, triethylene glycol monomethyl ether, triethylene glycol monobutyl ether, tripropylene glycol monomethyl ether, tetraethylene glycol monomethyl ether, tetraethylene glycol mono-n-dodecyl ether, heptaethylene glycol mono-n-dodecyl ether, and polyethylene glycol monomethyl ether. Among the above, alkoxy alcohols such as diethylene glycol monomethyl ether and diethylene glycol monoethyl ether are preferable.

Examples of polyalkylene glycol diesters include diethylene glycol diacetate and triethylene glycol diacetate. Among the above, diethylene glycol diacetate is preferable.

Examples of polyalkylene glycol ether esters include diethylene glycol monomethyl ether acetate, diethylene glycol monoethyl ether acetate, diethylene glycol mono-n-butyl ether acetate, triethylene glycol monomethyl ether acetate, and triethylene glycol monoethyl ether acetate. Among the above, diethylene glycol monomethyl ether acetate is preferable.

Among the above-mentioned neutral organic compounds, preferable are 2,3-butanedione, acetoin, ethyl lactate, methyl glycolate, dimethyl oxalate, diethyl oxalate, dimethyl malonate, diethyl malonate, methyl acetoacetate, ethyl acetoacetate, γ-butyrolactone, propylene carbonate, dimethoxyethane, diethylene glycol dimethyl ether, diethylene glycol diethyl ether, triethylene glycol dimethyl ether, tetraethylene glycol dimethyl ether, ethylene glycol, 1,3-propanediol, 1,2-propanediol, ethylene glycol monomethyl ether, ethylene glycol monoethyl ether, ethylene glycol diacetate, ethylene glycol monomethyl ether acetate, ethylene glycol monoethyl ether acetate, diethylene glycol, triethylene glycol, diethylene glycol monomethyl ether, diethylene glycol monoethyl ether, diethylene glycol diacetate, and diethylene glycol monomethyl ether acetate.

Among the above-mentioned neutral organic compounds, other preferable compounds are keto alcohols, hydroxy esters, diesters, ketoesters, lactones, carbonates, alkylene glycol diesters, alkylene glycol ether esters, polyalkylene glycol diesters, and polyalkylene glycol ether esters, because they can inhibit Cu surface cracking more effectively without damaging the low-k film.

Specific examples of these compounds include ethyl lactate, methyl glycolate, dimethyl oxalate, diethyl oxalate, dimethyl malonate, diethyl malonate, methyl acetoacetate, ethyl acetoacetate, γ-butyrolactone, propylene carbonate, ethylene glycol diacetate, ethylene glycol monomethyl ether acetate, ethylene glycol monoethyl ether acetate, diethylene glycol diacetate, and diethylene glycol monomethyl ether acetate.

Examples of monohydric alcohols with 4 or more carbon atoms include $C_{4-7}$ monohydric alcohols such as 1-butanol, tert-butyl alcohol, isobutyl alcohol, sec-butyl alcohol, pentyl alcohol, hexyl alcohol, and heptyl alcohol. Among the above, 1-butanol, isobutyl alcohol, and sec-butyl alcohol are preferable.

The amount (concentration) of the neutral organic compound and/or monohydric alcohol with 4 or more carbon atoms in the residue-removing solution is 0.1 to 60 wt %, preferably 1 to 40 wt %, and more preferably 2 to 15 wt %.

Some of the above-mentioned neutral organic compounds have ester groups easily hydrolyzed in aqueous solutions. Examples of such compounds include hydroxy esters, diesters, ketoesters, lactones, carbonates, alkylene glycol diesters, alkylene glycol ether esters, polyalkylene glycol diesters, and polyalkylene glycol ether esters. When the neutral organic compound has such an ester, it is preferable to further add a water-soluble base to the residue-removing solution for neutralizing $H^+$ produced by hydrolysis, or further add a polycarboxylic acid salt for controlling the $H^+$ produced. The addition of a polycarboxylic acid salt increases the effect of removing $Cu_xO$-containing residues and the effect of preventing Cu corrosion. It is preferable to use an amine as a water-soluble base, or an amine salt of a polycarboxylic acid, because the effect of preventing Cu surface cracking is also enhanced.

Examples of water-soluble bases include ammonia; hydroxylamine; primary, secondary, and tertiary amines such as methylamine, ethylamine, propylamine, butylamine, dimethylamine, diethylamine, dipropylamine, trimethylamine, and triethylamine; quaternary ammonium such as tetramethylammonium hydroxide, tetraethylammonium hydroxide, and choline; and polyamines such as hydrazine, ethylenediamine, propanediamine, diethylenetriamine, triaminotriethylamine, and triethylenetetramine. Preferable among the above are ethylamine, diethylamine, tetramethylammonium hydroxide, choline, propanediamine, and triethylenetetramine.

The water-soluble base may be added in an amount suitable to neutralize the pH to 4 to 7. Thus, the amount of the water-soluble base also depends on the amount of ester and its hydrolysis, and the hydrolysis depends on the temperature and other compositions. Therefore, the amount of the water-soluble base cannot be generally determined. The water-soluble base is preferably added in an amount suitable to neutralize the pH to 5 to 7, and more preferably 6 to 7.

A perchlorate may further be added. The perchlorate is a salt formed from perchloric acid and at least one base selected from the group consisting of ammonia, hydroxylamine, primary, secondary, and tertiary amines, quaternary ammonium, and polyamines. Examples of the perchlorate include ammonium perchlorate, methylamine perchlorate, propane polyamine perchlorate, and triethylenetetramine perchlorate. Among these, ammonium perchlorate is preferable.

The amount (concentration) of the perchlorate in the residue-removing solution is 0.1 to 10 wt %, preferably 0.3 to 5 wt %, and more preferably 0.5 to 3 wt %.

The strong acid capable of forming a complex or chelate with Cu is a Brønsted acid having a pKa at 25° C. of 3 or less, preferably 2 or less, and more preferably 0 to 2. Such an acid functions to remove residues after a dry process by donating the hydrogen ion $H^+$ and an agent (portion) that forms a chelate or complex with Cu.

Specific examples of the strong acid include halogen-containing carboxylic acids such as monochloroacetic acid, dichloroacetic acid, trichloroacetic acid, α-chlorobutanoic acid, β-chlorobutanoic acid, γ-chlorobutanoic acid, monofluoroacetic acid, difluoroacetic acid, and trifluoroacetic acid; inorganic acids such as hydrobromic acid, perchloric acid, and sulfuric acid; and polycarboxylic acids such as oxalic acid, malonic acid, tartaric acid, and citric acid. Preferable among the above are oxalic acid, malonic acid, citric acid, trifluoroacetic acid, hydrobromic acid, and perchloric acid; and more preferable are oxalic acid, malonic acid, citric acid, and trifluoroacetic acid.

The concentration of the strong acid in the residue-removing solution can be suitably selected according to the amount or nature of the residues to be removed after a dry process. The amount (concentration) of the strong acid in the residue-removing solution is typically about 0.1 to about 10 wt %, preferably 0.1 to 5 wt %, and more preferably 0.1 to 3 wt %. The lower the concentration of the strong acid, the more difficult the removal of residues after a dry process; while the higher the concentration, the easier the removal of the residues. The amount of the strong acid is preferably 5 wt % or less in consideration of cost-effectiveness.

Any of the above-mentioned compounds capable of forming a complex or chelate with Cu can be selected. Typical embodiments include the following.

For example, (A) at least one component selected from the group consisting of keto acids, keto acid salts, and aldehyde acid salts; (B) a combination of a strong acid capable of forming a complex or chelate with Cu and a polycarboxylic acid salt; (C) a combination of a neutral organic compound having two or more oxygen atoms capable of coordinating to Cu and a monohydric alcohol with 4 or more carbon atoms; and (D) a perchlorate. Specific examples of residue-removing solutions containing any of Compounds (A) to (D) will be mentioned later.

Although the use of a chemical solution containing any of Compounds (A) to (D) alone is effective for preventing Cu surface cracking, roughness, and oxidation, the addition of the above-mentioned Cu surface protective agent to the chemical solution further enhances the effect.

Fluorine Compound

The residue-removing solution of the invention may further contain a fluorine compound. This increases the effect of removing residues adhering to the side walls of the pattern made of an interlayer dielectric such as a low-k film. These residues include, in addition to Cu deterioration products, residues of the stopper film such as SiN, low-k film, filling material, and the like sputtered by dry etching, and may contain Si and organic substances. When these residues cannot be sufficiently removed, or when it is unclear whether the residues have been removed, a small amount of a fluorine compound can be added to provide a greater effect of removal.

Examples of fluorine compounds include hydrogen fluoride, and fluoride salts of ammonia, hydroxylamine, primary, secondary, and tertiary amines, quaternary ammonium, polyamines, and the like. More specifically, preferable examples include hydrogen fluoride, ammonium fluoride, ammonium monohydrogen difluoride, methylamine fluoride, ethylamine fluoride, diethylamine fluoride, triethylenetetramine fluoride, and tetramethylammonium fluoride. One or more of these fluorine compounds may be used. According to one embodiment of the invention, an aqueous ammonium fluoride solution or diluted hydrofluoric acid (50 wt % aqueous solution), for example, can be used.

The amount (concentration) of the fluorine compound can be suitably selected according to the types and amounts of the interlayer dielectric such as a silicon-containing film or low-k film, and the interlayer dielectric that has been plasma-damaged in a dry process.

The amount (concentration) of the fluorine compound in the residue-removing solution is preferably 0.001 to 5 wt %, and more preferably 0.01 to 3 wt %. When it is necessary to prevent the plasma-damaged portion of the interlayer dielectric from being etched with the residue-removing solution of the invention, a fluorine compound is preferably not added, or only a small amount (1 wt % or less) of a fluorine compound is preferably added. If, however, the amount of the fluorine compound is less than 0.001 wt %, the residue-removing effect will decrease.

Surfactant

The residue-removing solution of the invention may further contain a surfactant. A surfactant is added to increase the wettability of the hydrophobic interlayer dielectric, and prevent the inability of the chemical solution to be distributed, depending on the shape of the pattern. The surfactant is not limited, and may be a cationic, anionic, nonionic, or a like surfactant. The concentration of the surfactant is preferably 0.00001 to 5 wt %, and preferably 0.0001 to 3 wt %. If the concentration is less than 0.00001 wt %, the effect of surface activation will be small; however, even if the concentration exceeds 5 wt %, the effect will remain the same.

The proportion of water contained in the residue-removing solution of the invention is typically about 40 to about 99.5 wt %, and preferably about 50 to about 99 wt %. The proportion of water can be determined according to the proportions of components other than water.

Specific Embodiments of Residue-Removing Solution for Use After a Semiconductor Dry Process Residue-Removing Solution (A)

The residue-removing solution according to one embodiment of the invention contains, as a fundamental composition, at least one component selected from the group consisting of keto acids, keto acid salts, and aldehyde acid salts; a Cu surface protective agent; and water. The residue-removing solution can further contain a polycarboxylic acid salt, a neutral organic compound containing an oxygen atom capable of coordinating to Cu, a surfactant, a fluorine compound, an antioxidant, a crack inhibitor, and the like, to further exhibit additional superior function(s).

The type and the amount of the Cu surface protective agent may be those mentioned above.

The at least one component selected from the group consisting of keto acids, keto acid salts, and aldehyde acid salts functions to prevent Cu corrosion, and remove the residues after a dry process. Moreover, the component is capable of preventing minute cracking of the Cu surface, in addition to its typical function of preventing corrosion of the Cu bulk.

Examples of keto acids include pyruvic acid, levulinic acid, 5-aminolevulinic acid, α-ketoglutaric acid, and acetonedicarboxylic acid.

Examples of keto acid salts include salts formed from the above-mentioned keto acids such as pyruvic acid, levulinic acid, 5-aminolevulinic acid, α-ketoglutaric acid, and acetonedicarboxylic acid; and bases such as ammonia, hydroxylamine, primary, secondary, and tertiary amines, quaternary ammonium, and polyamines. Preferable among the above is a salt formed from at least one acid selected from the group consisting of pyruvic acid and levulinic acid; and at least one base selected from the group consisting of ammonia, methylamine, ethylamine, propylamine, butylamine, dimethylamine, diethylamine, trimethylamine, triethylamine, propanediamine, triethylenetetramine, tetramethylammonium hydroxide, and choline. A more preferable salt is diethylamine, tetramethylammonium hydroxide, or choline salt of pyruvic acid; or methylamine, ethylamine, or diethylamine salt of levulinic acid.

Examples of aldehyde acid salts include salts formed from glyoxylic acid and bases such as ammonia, hydroxylamine, primary, secondary, and tertiary amines, quaternary ammonium, and polyamines. Preferable among the above is butylamine, diethylamine, tetramethylammonium hydroxide, or choline salt of glyoxylic acid.

The keto acid salt or aldehyde acid salt may be used in the form of crystals, or in the form of an aqueous solution produced by mixing each acid and a base in water, and neutralizing the mixture.

The concentration of the at least one component selected from the group consisting of keto acids, keto acid salts, and aldehyde acid salts in the residue-removing solution can be suitably selected according to the amount or nature of the residues to be removed after a dry process.

The amount (concentration) of the at least one component selected from the group consisting of keto acids, keto acid salts, and aldehyde acid salts in the residue-removing solution may typically be about 0.1 to about 35 wt %.

More specifically, the amount (concentration) of the keto acid in the residue-removing solution may typically be 0.5 to 10 wt %, preferably 1 to 5 wt %, and more preferably 1 to 3 wt %. The lower the concentration of the keto acid, the smaller the residue-removing effect; while the higher the concentration, the greater the residue-removing effect and the longer the lifetime of the chemical solution. The concentration of the keto acid, however, is preferably 10 wt % or less, in consideration of cost-effectiveness and the tendency of an acid to cause Cu surface cracking.

The amount (concentration) of the aldehyde acid salt and/or keto acid salt in the residue-removing solution may typically be 0.1 to 35 wt %, preferably 0.3 to 15 wt %, and more preferably 0.5 to 10 wt %. The lower the concentration of these acids, the smaller the residue-removing effect. The effect is particularly small when the concentration is less than 0.1 wt %. The higher the concentration, the greater the effect of removal and the longer the lifetime of the chemical solution. However, the concentration is preferably 35 wt % or less, in consideration of cost-effectiveness.

Addition of a polycarboxylic acid salt to the residue-removing solution can enhance the effect of preventing Cu surface cracking, as well as the effect of removing the residues after a dry process. An amine salt of a polycarboxylic acid, in particular, exhibits a significant effect of preventing Cu surface cracking. Examples of such polycarboxylic acid salts include salts formed from polycarboxylic acids such as oxalic acid, malonic acid, succinic acid, glutaric acid, adipic acid, malic acid, tartaric acid, diammonium hydrogen citrate, ammonium dihydrogen citrate, and citric acid, with bases such as ammonia, hydroxylamine, primary, secondary, and tertiary amines, quaternary ammonium, alkanolamines, and polyamines. Preferable are salts formed from polycarboxylic acids such as oxalic acid, malonic acid, diammonium hydrogen citrate, ammonium dihydrogen citrate, and citric acid, with bases such as ammonia, primary, secondary, and tertiary amines, quaternary ammonium, alkanolamines, and polyamines.

Specific examples of preferable salts are salts of polycarboxylic acids such as oxalic acid, malonic acid, diammonium hydrogen citrate, ammonium dihydrogen citrate, and citric acid, with ammonium, methylamine, ethylamine, diethylamine, triethylamine, ethanolamine, diethanolamine, triethanolamine, diisopropanolamine, tri-iso-propanolamine, isopropanolamine, n-propanolamine, N,N-dimethylethanolamine, N-methylethanolamine, N-methyldiethanolamine, N-acetylethanolamine, N-ethylethanolamine, triethylenetetramine, tetramethylammonium hydroxide, and choline.

Most preferable of these salts are ammonium and methylamine salts of oxalic acid; ammonium, methylamine, ethylamine, tetramethylammonium hydroxide, and choline salts of malonic acid; methylamine, ethylamine, tetramethylammonium hydroxide, and choline salts of ammonium dihydrogen citrate; methylamine, ethylamine, tetramethylammonium hydroxide, and choline salts of ammonium dihydrogen citrate; and ammonium, methylamine, ethylamine, tetramethylammonium hydroxide, and choline salts of citric acid.

These polycarboxylic acid salts may be used in the form of crystals, or in the form of aqueous solutions produced by mixing these acids and bases in water, and neutralizing the mixtures. The amount (concentration) of the polycarboxylic acid salt in the residue-removing solution is 0.1 to 15 wt %, preferably 0.5 to 10 wt %, and more preferably 0.75 to 8 wt %. The lower the concentration of these acids, the smaller the residue-removing effect. The effect is particularly small when the concentration is less than 0.1 wt %. The higher the concentration, the greater the effect of removal and the longer the lifetime of the chemical solution. However, the concentration is preferably 10 wt % or less, in consideration of cost-effectiveness.

The residue-removing solution may further contain a fluorine compound and/or a neutral organic compound containing an oxygen atom capable of coordinating to Cu. This increases the effect of removing residues adhering to the side walls of the pattern made of an interlayer dielectric such as a low-k film. These residues include, in addition to Cu deterioration products, residues of the stopper film such as SiN, low-k film, filling material, and the like sputtered by dry etching, and may contain Si and organic substances. However, even if Si and organic substances are contained in the residues, when Cu oxide is the principal constituent, the residue-removing solution of the invention can usually remove these residues without incorporating a fluorine compound. Moreover, the interlayer dielectric such as a low-k film that has been plasma-damaged in a dry process is easily etched with a fluorine compound, possibly preventing the substrate from being processed according to the design dimensions. For this reason, when these residues cannot be sufficiently removed, or when it is unclear whether the residues have been removed, a small amount of a fluorine compound is preferably added to provide a greater effect of removal.

Examples of fluorine compounds include hydrogen fluoride, and fluoride salts of ammonia, hydroxylamine, primary, secondary, and tertiary amines, quaternary ammonium, polyamines, and the like. More specifically, preferable examples include hydrogen fluoride, ammonium fluoride, ammonium monohydrogen difluoride, methylamine fluoride, ethylamine fluoride, diethylamine fluoride, triethylenetetramine fluoride, and tetramethylammonium fluoride. One or more of these fluorine compounds may be used. According to one embodiment of the invention, an aqueous ammonium fluoride solution or diluted hydrofluoric acid (50 wt % aqueous solution), for example, can be used.

The concentration of the fluorine compound can be suitably selected according to the types and amounts of the interlayer dielectric such as a silicon-containing film or low-k film, and the interlayer dielectric that has been plasma-damaged in a dry process.

The amount (concentration) of the fluorine compound in the residue-removing solution is preferably 0.001 to 5 wt %, and more preferably 0.01 to 3 wt %. When it is necessary to prevent the plasma-damaged portion of the interlayer dielectric from being etched with the residue-removing solution of the invention, a fluorine compound is preferably not added, or only a small amount (1 wt % or less) of a fluorine compound is preferably added. If, however, the amount of the fluorine compound is less than 0.001 wt %, the residue-removing effect will decrease.

When the below-described neutral organic compound containing an oxygen atom capable of coordinating to Cu is added to the residue-removing solution of the invention, the degree of dissociation of the fluorine compound decreases. Thus, a large amount of fluorine compound is preferably added to provide an effect equal to that obtained using an aqueous solution not containing the neutral organic compound. If, however, the amount of fluorine compound exceeds 5 wt %, the plasma-damaged portion of the interlayer dielectric may be etched, preventing the substrate from being processed according to the design dimensions.

The residue-removing solution of the invention may further contain a neutral organic compound containing an oxygen atom capable of coordinating to Cu. The neutral organic compound is preferably a neutral organic solvent with two or more oxygen atoms, or an oxygen atom-containing neutral organic solvent with a hydrophobic group such as a long-chain alkyl group or the like. These organic solvents enhance the effect of removing residues adhering to the side walls of the pattern made of an interlayer dielectric such as a low-k film, as well as residues on the surface of the interlayer dielectric substrate, and exhibit the effect of preventing Cu corrosion. The term "neutral organic solvent" denotes solvents other than protogenic solvents (acidic solvents) and protophilic solvents (basic solvents).

Examples of such neutral organic compounds include polycarbonyls; hydroxy ketones; esters such as carbonates, cyclic esters, keto acid esters, oxyesters, and alkoxy esters; alcohols such as monohydric alcohols, polyhydric alcohols, and alkoxy alcohols; and polyethers.

Examples of polycarbonyls include 2,3-butanedione, 2,4-pentanedione, and methylglyoxal. 2,3-Butanedione and 2,4-pentanedione are preferable.

Examples of hydroxy ketones include acetoin, acetone alcohol, and diacetone alcohol. Acetoin and acetone alcohol are preferable.

Examples of esters include carbonates such as dimethyl carbonate and diethyl carbonate; cyclic esters such as propylene carbonate, ethylene carbonate, and γ-butyrolactone; keto acid esters such as methyl acetoacetate and ethyl acetoacetate; oxyesters such as methyl lactate, ethyl lactate, and butyl lactate; alkoxy esters such as ethylene glycol monomethyl ether acetate, ethylene glycol monoethyl ether acetate, ethylene glycol mono-n-butyl ether acetate, ethylene glycol monomethyl ether acetate, diethylene glycol monoethyl ether acetate, diethylene glycol mono-n-butyl ether acetate, ethylene glycol diacetate (ethylene diacetate), propylene glycol monomethyl ether acetate (PGMEA), and propylene glycol monoethyl ether acetate.

Preferable among the above are propylene carbonate, γ-butyrolactone, ethylene diacetate, PGMEA, methyl acetoacetate, ethyl acetoacetate, and ethyl lactate.

Examples of alcohols include monohydric alcohols with long-chain (e.g., $C_{3-6}$) alkyl groups or like hydrophobic groups, such as isopropyl alcohol, 1-butanol, tert-butyl alcohol, and isobutyl alcohol; polyhydric alcohols such as ethylene glycol, diethylene glycol, triethylene glycol, tetraethylene glycol, polyethylene glycol, propylene glycol, dipropylene glycol, poly(propylene glycol), glycerol, 2-amino-2-ethyl-1,3-propanediol, 2-amino-2-methyl-1,3-propanediol, 1,2-cyclohexanediol, 2,2-dimethyl-1,3-propanediol, 2,5-dimethyl-2,5-hexanediol, 2,3-naphthalenediol, 1,2-butanediol, 1,3-butanediol, 1,4-butanediol, 2-butyne-1,4-diol, 2-butene-1,4-diol, 1,3-propanediol, 1,2-propanediol, DL-1,2-hexanediol, 2,5-hexanediol, 1,2-benzenediol, 2,4-pentanediol, and 2-methyl-2,4-pentanediol; and alkoxy alcohols such as ethylene glycol monomethyl ether, ethylene glycol monoethyl ether, ethylene glycol mono-n-butyl ether, ethylene glycol monophenyl ether, diethylene glycol monomethyl ether, diethylene glycol monoethyl ether, diethylene glycol monoisobutyl ether, diethylene glycol mono-n-butyl ether, diethylene glycol monobenzyl ether, diethylene glycol monohexyl ether, diethylene glycol monobenzyl ether, triethylene glycol monomethyl ether, triethylene glycol monobutyl ether, tripropylene glycol monomethyl ether, tetraethylene glycol monomethyl ether, tetraethylene glycol mono-n-dodecyl ether, heptaethylene glycol mono-n-dodecyl ether, and polyethylene glycol monomethyl ether.

Preferable among the above are isopropyl alcohol, 1-butanol, isobutyl alcohol, diethylene glycol, dipropylene glycol, triethylene glycol, and tetraethylene glycol.

Examples of polyethers include dimethoxymethane, diethoxymethane, dimethoxyethane, dimethoxypropane, ethylene glycol dimethyl ether, ethylene glycol methyl ethyl ether, ethylene glycol diethyl ether, ethylene glycol di-n-butyl ether, diethylene glycol dimethyl ether, diethylene glycol methyl ethyl ether, diethylene glycol diethyl ether, diethylene glycol di-n-butyl ether, triethylene glycol dimethyl ether, triethylene glycol ethyl methyl ether, triethylene glycol diethyl ether, tetraethylene glycol dimethyl ether, tetraethylene glycol diethyl ether, and polyethylene glycol dimethyl ether.

Preferable among the above are ethylene glycol dimethyl ether, diethylene glycol dimethyl ether, diethylene glycol diethyl ether, triethylene glycol dimethyl ether, and tetraethylene glycol dimethyl ether.

Preferable among the above-mentioned neutral organic compounds are 2,3-butanedione, 2,4-pentanedione (acetylacetone), acetoin, propylene carbonate, γ-butyrolactone, ethylene glycol mono-n-butyl ether acetate, diethylene glycol monoethyl ether acetate, diethylene glycol mono-n-butyl ether acetate, ethylene glycol diacetate (ethylene diacetate), propylene glycol monomethyl ether acetate (PGMEA), isopropyl alcohol, 1-butanol, tert-butyl alcohol, isobutyl alcohol, diethylene glycol, dipropylene glycol, triethylene glycol, tetraethylene glycol, glycerol, 2,2-dimethyl-1,3-propanediol, 1,3-propanediol, 2-methyl-2,4-pentanediol, ethylene glycol mono-n-butyl ether, ethylene glycol monophenyl ether, diethylene glycol monomethyl ether, diethylene glycol monoethyl ether, diethylene glycol mono-n-butyl ether, triethylene glycol monomethyl ether, triethylene glycol monobutyl ether, tripropylene glycol monomethyl ether, dimethoxymethane, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, and ethyl lactate.

More preferable are 2,3-butanedione, 2,4-pentanedione, acetoin, propylene carbonate, γ-butyrolactone, diethylene glycol monoethyl ether acetate, ethylene glycol diacetate (ethylene diacetate), propylene glycol monomethyl ether acetate (PGMEA), isopropyl alcohol, 1-butanol, isobutyl alcohol, diethylene glycol, dipropylene glycol, triethylene glycol, tetraethylene glycol, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, and ethyl lactate.

Particularly preferable are 2,3-butanedione, acetoin, propylene carbonate, diethylene glycol monoethyl ether acetate, ethylene glycol diacetate (ethylene diacetate), propylene glycol monomethyl ether acetate (PGMEA), isopropyl alcohol, diethylene glycol, triethylene glycol, tetraethylene glycol, ethylene glycol dimethyl ether, diethylene glycol dimethyl ether, triethylene glycol dimethyl ether, methyl acetoacetate, ethyl acetoacetate, and ethyl lactate.

The amount (concentration) of the neutral organic compound containing an oxygen atom capable of coordinating to Cu in the residue-removing solution is typically 0.1 to 60 wt %, and preferably 2 to 40 wt %.

The residue-removing solution of the invention may further contain a surfactant. The surfactant is added to increase the wettability of the hydrophobic interlayer dielectric, and prevent the inability of the chemical solution to be distributed, depending on the shape of the pattern. The surfactant is not limited, and may be a cationic, anionic, nonionic, or a like surfactant. The amount (concentration) of the surfactant is 0.00001 to 5 wt %, and preferably 0.0001 to 3 wt %. If the concentration is less than 0.00001 wt %, the effect of surface activation will be small; however, even if the concentration exceeds 5 wt %, the effect will remain the same.

The proportion of water contained in the residue-removing solution of the invention is typically about 40 to about 99.5 wt %, and preferably about 60 to about 99 wt %. The proportion of water can be determined according to the proportions of components other than water.

The pH of the residue-removing solution of the invention is 4 to 9. A pH of less than 4 will easily cause Cu corrosion, whereas a pH of more than 9 tends to damage the low-k film. The pH is preferably 4 to 7. The pH is adjusted according to the amounts of the aldehyde acid and/or keto acid and the base(s) during the preparation of salt(s).

For example, in the case of a residue-removing solution containing at least one component selected from the group consisting of keto acids, keto acid salts, and aldehyde acid salts; a Cu surface protective agent; and water; the amount of the at least one component selected from the group consisting of keto acids, keto acid salts, and aldehyde acid salts is about 0.1 to about 35 wt %, and preferably about 0.5 to about 20 wt %; the amount of the Cu surface protective agent is about 0.1 to about 1,000 ppm, and preferably 0.2 to 500 ppm; and the pH is about 4 to about 8, and preferably about 5 to about 7.

In the case of a residue-removing solution containing at least one component selected from the group consisting of keto acids, keto acid salts, and aldehyde acid salts; a neutral organic compound containing an oxygen atom capable of coordinating to Cu oxide; a Cu surface protective agent; and water; the amount of the at least one component selected from the group consisting of keto acids, keto acid salts, and aldehyde acid salts is about 0.5 to about 20 wt %, and preferably about 1 to about 10 wt %; the amount of the neutral organic compound is about 0.1 to about 60 wt %, and preferably about 2 to about 40 wt %; the amount of the Cu surface protective agent is about 0.2 to about 2,000 ppm, and preferably 0.5 to 1,000 ppm; and the pH is about 4 to about 8, and preferably about 5 to about 7.

In the case of a residue-removing solution containing at least one component selected from the group consisting of keto acids, keto acid salts, and aldehyde acid salts; a polycarboxylic acid salt; a Cu surface protective agent; and water; the amount of the at least one component selected from the group consisting of keto acids, keto acid salts, and aldehyde acid salts is about 0.1 to about 10 wt %, and preferably about 0.5 to about 5 wt %; the amount of the polycarboxylic acid salt is about 0.1 to about 10 wt %, and preferably about 0.5 to about 8 wt %; the amount of the Cu surface protective agent is about 0.5 to about 1,000 ppm, and preferably 1 to 500 ppm; and the pH is about 4 to about 6, and preferably about 5 to about 6.

In the case of a residue-removing solution containing at least one component selected from the group consisting of keto acids, keto acid salts, and aldehyde acid salts; a polycarboxylic acid salt; a neutral organic compound containing an oxygen atom capable of coordinating to Cu oxide; a Cu surface protective agent; and water; the amount of the at least one component selected from the group consisting of keto acids, keto acid salts, and aldehyde acid salts is about 0.1 to about 10 wt %, and preferably about 0.5 to about 5 wt %; the amount of the polycarboxylic acid salt is about 0.1 to about 10 wt %, and preferably about 0.5 to about 8 wt %; the amount of the neutral organic compound is about 0.1 to about 60 wt %, and preferably about 2 to about 40 wt %; the amount of the Cu surface protective agent is about 0.5 to about 3,000 ppm, and preferably 1 to 2,000 ppm; and the pH is about 4 to about 6, and preferably about 5 to about 6.

Residue-Removing Solution (B)

The residue-removing solution according to one embodiment of the invention contains, as a fundamental composition, a strong acid capable of forming a complex or chelate with Cu (hereinafter also referred to as the "strong acid); a polycarboxylic acid salt; a Cu surface protective agent; and water. The residue-removing solution can further contain an organic compound, a surfactant, a fluorine compound, a crack inhibitor, an antioxidant, and the like, to exhibit additional superior function(s).

The type and the amount of the Cu surface protective agent may be those mentioned above.

The strong acid capable of forming a complex or chelate with Cu is a Brønsted acid having a pKa at 25° C. of 3 or less, preferably 2 or less, and more preferably 0 to 2. This acid functions to remove residues after a dry process by donating the hydrogen ion $H^+$ and an agent (portion) that forms a chelate or complex with Cu.

Specific examples of the strong acid include halogen-containing carboxylic acids such as monochloroacetic acid, dichloroacetic acid, trichloroacetic acid, α-chlorobutanoic acid, β-chlorobutanoic acid, γ-chlorobutanoic acid, monofluoroacetic acid, difluoroacetic acid, and trifluoroacetic acid; hydrobromic acid, perchloric acid, sulfuric acid, oxalic acid, malonic acid, tartaric acid, and citric acid. Preferable among the above are oxalic acid, malonic acid, citric acid, trifluoroacetic acid, hydrobromic acid, and perchloric acid; and more preferable are oxalic acid, malonic acid, citric acid, and trifluoroacetic acid.

The concentration of the strong acid in the residue-removing solution can be suitably selected according to the amount or nature of the residues to be removed after a dry process.

The amount (concentration) of the strong acid in the residue-removing solution is typically about 0.1 to about 10 wt %, preferably 0.1 to 5 wt %, and more preferably 0.1 to 3 wt %. The lower the concentration of the strong acid, the more difficult the removal of residues after a dry process; while the higher the concentration, the easier the removal of the residues. The amount of the strong acid is preferably 5 wt % or less in consideration of cost-effectiveness.

The polycarboxylic acid salt reduces damage to the low-k film, and exhibits the effect of preventing Cu corrosion by interacting with the strong acid, as well as the effect of removing the residues containing Cu after a dry process. An amine salt of a polycarboxylic acid, in particular, exhibits a significant effect of inhibiting Cu surface cracking.

Examples of polycarboxylic acid salts include salts formed from polycarboxylic acids such as malonic acid, succinic acid, glutaric acid, adipic acid, malic acid, tartaric acid, diammonium hydrogen citrate, ammonium dihydrogen citrate, and citric acid, with bases such as ammonia, hydroxylamine, primary, secondary, and tertiary amines, quaternary ammonium, alkanolamines, and polyamines. Preferable are salts formed from polycarboxylic acids such as malonic acid, diammonium hydrogen citrate, ammonium dihydrogen citrate, and citric acid, with bases such as ammonia, primary, secondary, and tertiary amines, quaternary ammonium, alkanolamines, and polyamines.

More specific examples include salts of polycarboxylic acids such as malonic acid, diammonium hydrogen citrate, ammonium dihydrogen citrate, and citric acid, with ammonium, methylamine, ethylamine, propylamine, butylamine, dimethylamine, diethylamine, trimethylamine, triethylamine, ethanolamine, diethanolamine, triethanolamine, diisopropanolamine, tri-iso-propanolamine, isopropanolamine, n-propanolamine, N,N-dimethylethanolamine, N-methylethanolamine, N-methyldiethanolamine, N-acetylethanolamine, N-ethylethanolamine, propanediamine, triethylenetetramine, tetramethylammonium hydroxide, choline, and the like.

Most preferable of the above are ammonium, methylamine, ethylamine, tetramethylammonium hydroxide, and choline salts of malonic acid; methylamine, ethylamine, tetramethylammonium hydroxide, and choline salts of diammonium hydrogen citrate; methylamine, ethylamine, tetramethylammonium hydroxide, and choline salts of ammonium dihydrogen citrate; and ammonium, methylamine, ethylamine, tetramethylammonium hydroxide, and choline salts of citric acid.

These polycarboxylic acid salts may be used in the form of crystals, or in the form of aqueous solutions produced by mixing these acids and bases in water, and neutralizing the mixtures. The amount (concentration) of the polycarboxylic acid salt in the residue-removing solution is typically 0.1 to 20 wt %, preferably 0.5 to 10 wt %, and more preferably 1 to 5 wt %.

The ratio of the number of moles of the strong acid capable of forming a complex or chelate with Cu relative to the number of moles of the polycarboxylic acid salt (strong acid/polycarboxylic acid salt) in the residue-removing solution is preferably about 0.3 to about 1, and particularly preferably 0.35 to 0.8. This is because if the ratio is 0.3 or less, Cu corrosion will easily occur; and if the ratio is 1 or more, the ability to remove residues after a dry process will decrease.

The residue-removing solution of the invention may contain an organic compound (particularly a water-soluble organic compound). This organic compound reduces Cu corrosion due to the strong acid, and exhibits the effect of removing residues after a dry process, such as residues adhering to the side walls of the pattern made of an interlayer dielectric such as a low-k film, as well as residues on the surface of the interlayer dielectric substrate.

Examples of organic compounds include hydrophilic or water-soluble neutral organic compounds. Examples of such neutral organic compounds include polycarbonyls, hydroxy ketones, esters, alcohols with 3 or more carbon atoms, aldehydes with 3 or more carbon atoms, polyethers, and sulfones.

Examples of polycarbonyls include 2,3-butanedione, 2,4-pentanedione, methylglyoxal, and acetylacetone. 2,3-Butanedione and 2,4-pentanedione are preferable.

Examples of hydroxy ketones include acetoin, acetone alcohol, and diacetone alcohol. Acetoin and acetone alcohol are preferable.

Examples of esters include monocarboxylic acid esters such as methyl acetate, ethyl acetate, methyl propionate, and ethyl propionate; polycarboxylic acid esters such as dimethyl oxalate, diethyl oxalate, dimethyl malonate, diethyl malonate, and dimethyl succinate; carbonates such as dimethyl carbonate and diethyl carbonate; cyclic esters such as propylene carbonate, ethylene carbonate, and γ-butyrolactone; keto acid esters such as methyl acetoacetate and ethyl acetoacetate; oxyesters such as methyl lactate, ethyl lactate, and butyl lactate; alkoxy esters such as ethylene glycol monomethyl ether acetate, ethylene glycol monoethyl ether acetate, ethylene glycol mono-n-butyl ether acetate, diethylene glycol monomethyl ether acetate, diethylene glycol monoethyl ether acetate, diethylene glycol mono-n-butyl ether acetate, ethylene glycol diacetate (ethylene diacetate), propylene glycol monomethyl ether acetate (PGMEA), and propylene glycol monoethyl ether acetate. Preferable among the above are propylene carbonate, γ-butyrolactone, ethylene diacetate, PGMEA, methyl acetoacetate, ethyl acetoacetate, and ethyl lactate.

Examples of alcohols with 3 or more carbon atoms include monohydric alcohols with long-chain (e.g., $C_{3-6}$) alkyl groups or like hydrophobic groups, such as isopropyl alcohol, 1-butanol, tert-butyl alcohol, and isobutyl alcohol; polyhydric alcohols such as ethylene glycol diethylene glycol, triethylene glycol, tetraethylene glycol, polyethylene glycol, propylene glycol, dipropylene glycol, poly(propylene glycol), glycerol, 2-amino-2-ethyl-1,3-propanediol, 2-amino-2-methyl-1,3-propanediol, 1,2-cyclohexanediol, 2,2-dimethyl-1,3-propanediol, 2,5-dimethyl-2,5-hexanediol, 2,3-naphthalenediol, 1,2-butanediol, 1,3-butanediol, 1,4-butanediol, 2-butyne-1,4-diol, 2-butene-1,4-diol, 1,3-propanediol, 1,2-propanediol, DL-1,2-hexanediol, 2,5-hexanediol, 1,2-benzenediol, 2,4-pentanediol, and 2-methyl-2,4-pentanediol; and alkoxy alcohols such as ethylene glycol monomethyl ether, ethylene glycol monoethyl ether, ethylene glycol mono-n-butyl ether, ethylene glycol monophenyl ether, diethylene glycol monomethyl ether, diethylene glycol monoethyl ether, diethylene glycol monoisobutyl ether, diethylene glycol mono-n-butyl ether, diethylene glycol monobenzyl ether, diethylene glycol monohexyl ether, diethylene glycol monobenzyl ether, triethylene glycol monomethyl ether, triethylene glycol monobutyl ether, tripropylene glycol monomethyl ether, tetraethylene glycol monomethyl ether, tetraethylene glycol mono-n-dodecyl ether, heptaethylene glycol mono-n-dodecyl ether, and polyethylene glycol monomethyl ether. Preferable among the above are isopropyl alcohol, 1-butanol, isobutyl alcohol, diethylene glycol, dipropylene glycol, triethylene glycol, and tetraethylene glycol.

Examples of aldehydes with 3 or more carbon atoms include propionaldehyde, butanal, and pentanal.

Examples of polyethers include dimethoxymethane, diethoxymethane, dimethoxyethane, dimethoxypropane, ethylene glycol dimethyl ether, ethylene glycol methyl ethyl ether, ethylene glycol diethyl ether, ethylene glycol di-n-butyl ether, diethylene glycol dimethyl ether, diethylene glycol methyl ethyl ether, diethylene glycol diethyl ether, diethylene glycol di-n-butyl ether, triethylene glycol dimethyl ether, triethylene glycol ethyl methyl ether, triethylene glycol diethyl ether, tetraethylene glycol dimethyl ether, tetraethylene glycol diethyl ether, and polyethylene glycol dimethyl ether. Preferable among the above are ethylene glycol dimethyl ether, diethylene glycol dimethyl ether, diethylene glycol diethyl ether, triethylene glycol dimethyl ether, and tetraethylene glycol dimethyl ether.

Examples of sulfones include sulfolane and dimethyl sulfone.

Suitable among the above-mentioned organic compounds are 2,3-butanedione, 2,4-pentanedione, acetoin, propylene carbonate, γ-butyrolactone, ethylene glycol diacetate (ethylene diacetate), propylene glycol monomethyl ether acetate (PGMEA), isopropyl alcohol, 1-butanol, isobutyl alcohol, diethylene glycol, dipropylene glycol, triethylene glycol, tetraethylene glycol, diethylene glycol monoethyl ether acetate, ethylene glycol monomethyl ether acetate, ethylene glycol monoethyl ether acetate, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, and ethyl lactate.

The amount (concentration) of the organic compound in the residue-removing solution is 60 wt % or less, preferably 0.5 to 60 wt %, more preferably 2 to 40 wt %, and particularly preferably 3 to 30 wt %.

The residue-removing solution of the invention may further contain a fluorine compound. This increases the effect of removing residues adhering to the side walls of the pattern made of an interlayer dielectric such as a low-k film. These residues include, in addition to Cu deterioration products, residues of the stopper film such as SiN, low-k film, filling material, and the like sputtered by dry etching, and may contain Si and organic substances. However, even if Si and organic substances are contained in the residues, when Cu oxide is the principal constituent, the residue-removing solution of the invention can usually remove these residues without incorporating a fluorine compound. Moreover, the interlayer dielectric such as a low-k film that has been plasma-damaged in a dry process is easily etched with a fluorine compound, possibly preventing the substrate from being processed according to the design dimensions. For this reason, when these residues cannot be sufficiently removed, or when it is unclear whether the residues have been removed, a small amount of a fluorine compound is preferably added to provide a greater effect of removal.

Examples of fluorine compounds include hydrogen fluoride, fluoride salts of ammonia, hydroxylamine, primary, secondary, and tertiary amines, quaternary ammonium, polyamines, and the like. More specifically, preferable examples include hydrogen fluoride, ammonium fluoride, ammonium monohydrogen difluoride, methylamine fluoride, ethylamine fluoride, diethylamine fluoride, triethylenetetramine fluoride, and tetramethylammonium fluoride. One or more of these fluorine compounds may be used. According to one embodiment of the invention, an aqueous ammonium fluoride solution or diluted hydrofluoric acid (50 wt % aqueous solution), for example, can be used.

The concentration of the fluorine compound can be suitably selected according to the types and amounts of the interlayer dielectric such as a silicon-containing film or a low-k film, and the interlayer dielectric that has been plasma-damaged in a dry process.

The amount (concentration) of the fluorine compound in the residue-removing solution is preferably 0.001 to 5 wt %, and more preferably 0.01 to 3 wt %. When it is necessary to prevent the plasma-damaged portion of the interlayer dielectric from being etched with the residue-removing solution of the invention, a fluorine compound is preferably not added, or only a small amount (1 wt % or less) of a fluorine compound is preferably added. If, however, the amount of the fluorine compound is less than 0.001 wt %, the residue-removing effect will decrease. Particularly in the case of a residue-removing solution containing the strong acid, the amount of the fluorine compound is preferably 1 wt % or less. In the case of a residue-removing solution containing a polycarboxylic acid salt, the amount of the fluorine compound is preferably 5 wt % or less.

The residue-removing solution of the invention may further contain a surfactant. The surfactant is added to increase the wettability of the hydrophobic interlayer dielectric, and prevent the inability of the chemical solution to be distributed, depending on the shape of the pattern. The surfactant is not limited, and may be a cationic, anionic, nonionic, or a like surfactant. The amount (concentration) of the surfactant is 0.00001 to 5 wt %, and preferably 0.0001 to 3 wt %. If the concentration is less than 0.00001 wt %, the effect of surface activation will be small; however, even if the concentration exceeds 5 wt %, the effect will remain the same.

The proportion of water contained in the residue-removing solution of the invention is typically about 40 to about 99.5 wt %, and preferably about 70 to about 99 wt %. The proportion of water can be determined according to the proportions of components other than water.

The pH of the residue-removing solution of the invention is 4 to 7. If the pH is less than 4, the low-k film surface damaged in the dry process will easily deteriorate; and if the pH exceeds 7, Cu corrosion will easily occur. The pH is preferably 4 to 6.5. The pH is adjusted depending on the amounts of the strong acid and polycarboxylic acid salt, and, if necessary, the amount of the organic compound.

For example, in the case of a residue-removing solution containing a strong acid capable of forming a complex or chelate with Cu; a polycarboxylic acid salt; a Cu surface protective agent; and water; the amount of the strong acid is about 0.1 to about 5 wt %, and preferably about 0.3 to about 3 wt %; the amount of the polycarboxylic acid salt is about 0.1 to about 20 wt %, and preferably about 0.5 to about 10 wt %; the amount of the Cu surface protective agent is about 0.5 to about 1,000 ppm, and preferably 1 to 500 ppm; and the pH is about 4 to about 6.5, and preferably about 4 to about 6. The ratio of the number of moles of the strong acid relative to the number of moles of the polycarboxylic acid salt is about 0.3 to about 1, and preferably about 0.35 to about 0.8.

In the case of a residue-removing solution containing a strong acid capable of forming a complex or chelate with Cu; a polycarboxylic acid salt; an organic compound; a Cu surface protective agent; and water; the amount of the strong acid is about 0.1 to about 5 wt %, and preferably about 0.3 to about 3 wt %; the amount of the polycarboxylic acid salt is about 0.5 to about 20 wt %, and preferably about 0.75 to about 10 wt %; the amount of the organic compound is about 0.5 to about 60 wt %, preferably about 2 to about 40 wt %, and more preferably 3 to 30 wt %; the amount of the Cu surface protective agent is about 0.5 to about 3,000 ppm, and preferably 1 to 2,000 ppm; and the pH is about 4 to about 7, and preferably about 4 to about 6. The ratio of the number of moles of the strong acid relative to the number of moles of the polycarboxylic acid salt is about 0.3 to about 1, and preferably about 0.35 to about 0.8.

Residue-Removing Solution (C)

The residue-removing solution according to one embodiment of the invention is an aqueous solution containing, as a fundamental composition, water; and a neutral organic compound having two or more oxygen atoms capable of coordinating to Cu (hereinafter also referred to as the "neutral organic compound") and/or a monohydric alcohol with 4 or more carbon atoms.

The type and the amount of the Cu surface protective agent may be those mentioned above.

The neutral organic compound may be any neutral organic compound having two or more oxygen coordination sites for Cu. The term "neutral" denotes compounds other than protogenic (acidic) solvents and protophilic (basic) solvents. Examples of such neutral organic compounds include polycarbonyls, keto alcohols, hydroxy esters, diesters, ketoesters, lactones, carbonates, polyethers, glycols, alkylene glycol monoethers, alkylene glycol diesters, alkylene glycol ether esters, polyalkyleneglycols, polyalkylene glycol monoethers, polyalkylene glycol diesters, and polyalkylene glycol ether esters.

Examples of polycarbonyls include dialdehydes such as glyoxal; diketones such as 2,3-butanedione, 2,4-pentanedione (acetylacetone), 2,3-pentanedione, 1,2-cyclohexanedione, and 3,4-hexanedione; and keto aldehydes such as methylglyoxal. Among the above, 2,3-butanedione is preferable.

Examples of keto alcohols include acetoin, diacetone alcohol, and acetonyl alcohol. Among the above, acetoin is preferable.

Examples of hydroxy esters include methyl lactate, ethyl lactate, butyl lactate, methyl glycolate, ethyl glycolate, dimethyl tartarate, diethyl tartrate, and methyl glycolate. Among the above, ethyl lactate and methyl glycolate are preferable.

Examples of diesters include dimethyl oxalate, diethyl oxalate, dimethyl malonate, diethyl malonate, dimethyl succinate, diethyl succinate, dimethyl glutarate, diethyl glutarate, dimethyl adipate, and dimethyl maleate. Among the above, dimethyl oxalate, diethyl oxalate, dimethyl malonate, and diethyl malonate are preferable.

Examples of ketoesters include methyl acetoacetate, ethyl acetoacetate, methyl pyruvate, and butyl levulinate. Among the above, methyl acetoacetate and ethyl acetoacetate are preferable.

Examples of lactones include γ-butyrolactone, glucono-δ-lactone, and δ-valerolactone. Among the above, γ-butyrolactone is preferable.

Examples of carbonates include propylene carbonate, ethylene carbonate, dimethyl carbonate, and diethyl carbonate. Among the above, propylene carbonate is preferable.

Examples of polyethers include glycol dialkyl ethers such as dimethoxymethane, dimethoxyethane, diethoxymethane, ethylene glycol methyl ethyl ether, dimethoxyethane, diethoxymethane, diethoxyethane, ethylene glycol di-n-butyl ether, and dimethoxypropane; polyalkylene glycol dialkyl ethers such as diethylene glycol dimethyl ether, diethylene glycol methyl ethyl ether, diethylene glycol diethyl ether, diethylene glycol di-n-butyl ether, triethylene glycol dimethyl ether, triethylene glycol ethyl methyl ether, triethylene glycol diethyl ether, tetraethylene glycol dimethyl ether, tetraethylene glycol diethyl ether, and polyethylene glycol dimethyl ether.

Preferable among the above are dimethoxyethane, diethylene glycol dimethyl ether, diethylene glycol diethyl ether, triethylene glycol dimethyl ether, and tetraethylene glycol dimethyl ether.

Examples of glycols include ethylene glycol; 1,3-propanediol; 1,2-propanediol; glycerol; 1,2-cyclohexanediol; 2,2-dimethyl-1,3-propanediol; 2,5-dimethyl-2,5-hexanediol; 2,3-naphthalenediol; 1,2-butanediol; 1,3-butanediol; 1,4-butanediol; 2-butyne-1,4-diol; 2-butene-1,4-diol; DL-1,2-hexanediol; 2,5-hexanediol; 1,2-benzenediol; 2,4-pentanediol; and 2-methyl-2,4-pentanediol. Among the above, ethylene glycol; 1,3-propanediol; and 1,2-propanediol are preferable.

Examples of alkylene glycol monoethers include ethylene glycol monomethyl ether, ethylene glycol monoethyl ether, ethylene glycol mono-n-butyl ether, and ethylene glycol monophenyl ether. Among the above, ethylene glycol monomethyl ether and ethylene glycol monoethyl ether are preferable.

Examples of alkylene glycol diesters include ethylene glycol diacetate and propylene glycol diacetate. Among these, ethylene glycol diacetate is preferable.

Examples of alkylene glycol ether esters include ethylene glycol monomethyl ether acetate, ethylene glycol monoethyl ether acetate, propylene glycol monomethyl ether acetate, ethylene glycol mono-n-butyl ether acetate, propylene glycol monomethyl ether acetate, propylene glycol monoethyl ether acetate, and ethylene glycol mono-n-butyl ether acetate. Among the above, ethylene glycol monomethyl ether acetate and ethylene glycol monoethyl ether acetate are preferable.

Examples of polyalkyleneglycols include diethylene glycol, triethylene glycol, tetraethylene glycol, polyethylene glycol, dipropylene glycol, poly(propylene glycol), and glycerol. Among the above, diethylene glycol and triethylene glycol are preferable.

Examples of polyalkylene glycol monoethers include diethylene glycol monomethyl ether, diethylene glycol monoethyl ether, diethylene glycol monoisobutyl ether, diethylene glycol mono-n-butyl ether, diethylene glycol monobenzyl ether, diethylene glycol monohexyl ether, diethylene glycol monobenzyl ether, triethylene glycol monomethyl ether, triethylene glycol monobutyl ether, tripropylene glycol monomethyl ether, tetraethylene glycol monomethyl ether, tetraethylene glycol mono-n-dodecyl ether, heptaethylene glycol mono-n-dodecyl ether, and polyethylene glycol monomethyl ether. Among the above, alkoxy alcohols such as diethylene glycol monomethyl ether and diethylene glycol monoethyl ether are preferable.

Examples of polyalkylene glycol diesters include diethylene glycol diacetate and triethylene glycol diacetate. Among the above, diethylene glycol diacetate is preferable.

Examples of polyalkylene glycol ether esters include diethylene glycol monomethyl ether acetate, diethylene glycol monoethyl ether acetate, diethylene glycol mono-n-butyl ether acetate, triethylene glycol monomethyl ether acetate, and triethylene glycol monoethyl ether acetate. Among the above, diethylene glycol monomethyl ether acetate is preferable.

Among the above-mentioned neutral organic compounds, preferable are 2,3-butanedione, acetoin, ethyl lactate, methyl glycolate, dimethyl oxalate, diethyl oxalate, dimethyl malonate, diethyl malonate, methyl acetoacetate, ethyl acetoacetate, γ-butyrolactone, propylene carbonate, dimethoxyethane, diethylene glycol dimethyl ether, diethylene glycol diethyl ether, triethylene glycol dimethyl ether, tetraethylene glycol dimethyl ether, ethylene glycol, 1,3-propanediol, 1,2-propanediol, ethylene glycol monomethyl ether, ethylene glycol monoethyl ether, ethylene glycol diacetate, ethylene glycol monomethyl ether acetate, ethylene glycol monoethyl ether acetate, diethylene glycol, triethylene glycol, diethylene glycol monomethyl ether, diethylene glycol monoethyl ether, diethylene glycol diacetate, and diethylene glycol monomethyl ether acetate.

Among the above-mentioned neutral organic compounds, other preferable compounds are keto alcohols, hydroxy esters, diesters, ketoesters, lactones, carbonates, alkylene glycol diesters, alkylene glycol ether esters, polyalkylene glycol diesters, and polyalkylene glycol ether esters, because they can inhibit Cu surface cracking more effectively without damaging the low-k film.

Specific examples include ethyl lactate, methyl glycolate, dimethyl oxalate, diethyl oxalate, dimethyl malonate, diethyl malonate, methyl acetoacetate, ethyl acetoacetate, γ-butyrolactone, propylene carbonate, ethylene glycol diacetate, ethylene glycol monomethyl ether acetate, ethylene glycol monoethyl ether acetate, diethylene glycol diacetate, and diethylene glycol monomethyl ether acetate.

Examples of monohydric alcohols with 4 or more carbon atoms include $C_{4-7}$ monohydric alcohols such as 1-butanol, tert-butyl alcohol, isobutyl alcohol, sec-butyl alcohol, pentyl alcohol, hexyl alcohol, and heptyl alcohol. Among the above, 1-butanol, isobutyl alcohol, and sec-butyl alcohol are preferable.

The amount (concentration) of the neutral organic compound and/or monohydric alcohol with 4 or more carbon atoms in the residue-removing solution is 0.1 to 60 wt %, preferably 1 to 40 wt %, and more preferably 2 to 15 wt %.

Some of the above-mentioned neutral organic compounds have ester groups easily hydrolyzed in aqueous solutions. Examples of such compounds include hydroxy esters, diesters, ketoesters, lactones, carbonates, alkylene glycol diesters, alkylene glycol ether esters, polyalkylene glycol diesters, and polyalkylene glycol ether esters. When the neutral organic compound has such an ester, it is preferable to further add a water-soluble base to the residue-removing solution for neutralizing $H^+$ produced by hydrolysis, or further add a polycarboxylic acid salt for controlling the $H^+$ produced. The addition of a polycarboxylic acid salt increases the effect of removing $Cu_xO$-containing residues and the effect of preventing Cu corrosion. It is preferable to use an amine as a water-soluble base, or an amine salt of a polycarboxylic acid, because the effect of preventing Cu surface cracking is also enhanced.

Examples of water-soluble bases include ammonia; hydroxylamine; primary, secondary, and tertiary amines such as methylamine, ethylamine, propylamine, butylamine, dimethylamine, diethylamine, dipropylamine, trimethylamine, and triethylamine; quaternary ammonium such as tetramethylammonium hydroxide, tetraethylammonium hydroxide, and choline; and polyamines such as hydrazine, ethylenediamine, propanediamine, diethylenetriamine, triaminotriethylamine, and triethylenetetramine. Preferable among the above are ethylamine, diethylamine, tetramethylammonium hydroxide, choline, propanediamine, and triethylenetetramine.

The water-soluble base may be added in an amount suitable to neutralize the pH to 4 to 7. Thus, the amount of the water-soluble base also depends on the amount of ester and its hydrolysis, and the hydrolysis depends on the temperature and other compositions. Therefore, the amount of the water-soluble base cannot be generally determined. The water-soluble base is preferably added in an amount suitable to neutralize the pH to 5 to 7, and more preferably 6 to 7.

Examples of polycarboxylic acid salts include salts formed from polycarboxylic acids such as oxalic acid, malonic acid, succinic acid, glutaric acid, adipic acid, malic acid, tartaric acid, diammonium hydrogen citrate, ammonium dihydrogen citrate, and citric acid, with bases such as ammonia, hydroxylamine, primary, secondary, and tertiary amines, quaternary ammonium, alkanolamines, and polyamines. Examples of preferable salts are those formed from polycarboxylic acids such as malonic acid, diammonium hydrogen citrate, ammonium dihydrogen citrate, and citric acid; and bases such as ammonia, primary, secondary, and tertiary amines, quaternary ammonium, and polyamines.

More specific examples include salts of polycarboxylic acids such as malonic acid, diammonium hydrogen citrate, ammonium dihydrogen citrate, and citric acid, with ammonium, methylamine, ethylamine, propylamine, butylamine, dimethylamine, diethylamine, trimethylamine, triethylamine, ethanolamine, diethanolamine, triethanolamine, diisopropanolamine, tri-iso-propanolamine, isopropanolamine, n-propanolamine, N,N-dimethylethanolamine, N-methylethanolamine, N-methyldiethanolamine, N-acetylethanolamine, N-ethylethanolamine, propanediamine, tetramethylammonium hydroxide, choline, and the like.

Most preferable of these salts are ammonium, methylamine, ethylamine, tetramethylammonium hydroxide, and choline salts of malonic acid; methylamine, ethylamine, tetramethylammonium hydroxide, and choline salts of diammonium hydrogen citrate; methylamine, ethylamine, tetramethylammonium hydroxide, and choline salts of ammonium dihydrogen citrate; and ammonium, methylamine, ethylamine, tetramethylammonium hydroxide, and choline salts of citric acid.

These polycarboxylic acid salts may be used in the form of crystals, or in the form of aqueous solutions produced by mixing these acids and bases in water, and neutralizing the mixtures. The amount (concentration) of the polycarboxylic acid salt in the residue-removing solution is 0.1 to 15 wt %, preferably 0.5 to 10 wt %, and more preferably 0.75 to 8 wt %.

A perchlorate may further be added. The perchlorate is a salt formed with at least one base selected from the group consisting of ammonia, hydroxylamine, primary, secondary, and tertiary amines, quaternary ammonium, and polyamines. Examples of the perchlorate include ammonium perchlorate, methylamine perchlorate, propane polyamine perchlorate, and triethylenetetramine perchlorate. Among the above, ammonium perchlorate is preferable.

The amount (concentration) of the perchlorate in the residue-removing solution is 0.1 to 10 wt %, preferably 0.3 to 5 wt %, and more preferably 0.5 to 3 wt %.

Although the residue-removing solution of the invention basically does not contain a fluorine compound, it may further contain a fluorine compound when a monohydric alcohol with 4 or more carbon atoms is used, and/or when any of keto alcohols, hydroxy esters, diesters, ketoesters, lactones, carbonates, alkylene glycol diesters, alkylene glycol ether esters, polyalkylene glycol diesters, and polyalkylene glycol ether esters is used as a neutral organic compound.

The addition of a fluorine compound can increase the effect of removing residues adhering to the side walls of the pattern made of an interlayer dielectric such as a low-k film. These residues include, in addition to Cu deterioration products, residues of the stopper film such as SiN, low-k film, filling material, and the like sputtered by dry etching, and may contain Si and organic substances. However, even if Si and organic substances are contained in the residues, when Cu oxide is the principal constituent, the residue-removing solution of the invention can usually remove these residues without incorporating a fluorine compound. Moreover, the interlayer dielectric such as a low-k film that has been plasma-damaged in a dry process is easily etched with a fluorine compound, possibly preventing the substrate from being processed according to the design dimensions. For this reason, when these residues cannot be sufficiently removed, or when it is unclear whether the residues have been removed, a small amount of a fluorine compound is preferably added to provide a greater effect of removal.

Examples of fluorine compounds include hydrogen fluoride, and fluoride salts of ammonia, hydroxylamine, primary, secondary, and tertiary amines, quaternary ammonium, polyamines, and the like. More specifically, preferable examples include hydrogen fluoride, ammonium fluoride, ammonium monohydrogen difluoride, methylamine fluoride, ethylamine fluoride, diethylamine fluoride, triethylenetetramine fluoride, and tetramethylammonium fluoride. One or more of such fluorine compounds may be used. According to one embodiment of the invention, an aqueous ammonium fluoride solution or diluted hydrofluoric acid (50 wt % aqueous solution), for example, can be used.

The amount (concentration) of the fluorine compound can be suitably selected according to the types and amounts of the interlayer dielectric such as a silicon-containing film or low-k film, and the interlayer dielectric that has been plasma-damaged in a dry process.

The amount (concentration) of the fluorine compound in the residue-removing solution is preferably 0.001 to 5 wt %, and more preferably 0.01 to 3 wt %. When it is necessary to prevent the plasma-damaged portion of the interlayer dielectric from being etched with the residue-removing solution of the invention, a fluorine compound is preferably not added, or only a small amount (1 wt % or less) of a fluorine compound is preferably added. If, however, the amount of the fluorine compound is less than 0.001 wt %, the residue-removing effect will decrease.

The residue-removing solution of the invention may further contain a surfactant. Such a surfactant is added to increase the wettability of the hydrophobic interlayer dielectric, and prevent the inability of the chemical solution to be distributed, depending on the shape of the pattern. The surfactant is not limited, and may be a cationic, anionic, nonionic, or a like surfactant. The concentration of the surfactant is preferably 0.00001 to 5 wt %, and preferably 0.0001 to 3 wt %. If the concentration is less than 0.00001 wt %, the effect of surface activation will be small; however, even if the concentration exceeds 5 wt %, the effect will remain the same.

The proportion of water contained in the residue-removing solution of the invention is typically about 40 to about 99.5 wt %, and preferably about 60 to about 99 wt %. The proportion of water can be determined according to the proportions of components other than water.

The pH of the residue-removing solution of the invention is 4 to 7. A pH of 4 or less tends to cause Cu corrosion, whereas a pH of more than 7 may damage the low-k film. The pH is preferably 4 to 6. The pH is adjusted with a base.

Specific examples of the residue-removing solution (C) of the invention are as follows.

In the case of a residue-removing solution containing a neutral organic compound, a Cu surface protective agent, and water; the amount of the neutral organic compound is about 0.1 to about 60 wt %, and preferably about 3 to about 20 wt %; the amount of the Cu surface protective agent is about 0.2 to about 2,000 ppm, and preferably 0.5 to 1,000 ppm; and the pH is about 4 to about 7, and preferably about 4 to about 6.

In the case of a residue-removing solution containing a monohydric alcohol with 4 or more carbon atoms, a Cu surface protective agent, and water; the amount of the monohydric alcohol with 4 or more carbon atoms is about 1 to about 10 wt %, and preferably about 2 to about 5 wt %; the amount of the Cu surface protective agent is about 0.2 to about 1,000 ppm, and preferably 0.5 to 500 ppm; and the pH is about 4 to about 7, and preferably about 5 to about 7.

In the case of a residue-removing solution containing a neutral organic compound, a water-soluble base, a Cu surface protective agent, and water; the amount of the neutral organic compound is about 0.1 to about 20 wt %, and preferably about 1 to about 10 wt %; the amount of the water-soluble base is about 0.05 to about 5 wt %, and preferably about 0.1 to about 3 wt %; the amount of the Cu surface protective agent is about 0.2 to about 2,000 ppm, and preferably 0.5 to 1,000 ppm; and the pH is about 4 to about 7, and preferably about 4 to about 6.

In the case of a residue-removing solution containing a neutral organic compound, a polycarboxylic acid salt, a Cu surface protective agent, and water; the amount of the neutral organic compound is about 0.1 to about 60 wt %, and preferably about 3 to about 20 wt %; the amount of the polycarboxylic acid salt is about 0.1 to about 10 wt %, and preferably about 0.5 to about 5 wt %; the amount of the Cu surface protective agent is about 0.5 to about 3,000 ppm, and preferably 1 to 2,000 ppm; and the pH is about 4 to about 7, and preferably about 4 to about 6.

Residue-Removing Solution (D)

The residue-removing solution according to one embodiment of the invention is an aqueous solution containing a perchlorate and water.

The type and the amount of the Cu surface protective agent may be those mentioned above.

Perchlorates as mentioned above in the section "Residue-Removing Solution (C)" can be used. Specifically, the perchlorate is a salt formed with at least one base selected from the group consisting of ammonia, hydroxylamine, primary, secondary, and tertiary amines, quaternary ammonium, and polyamines. Examples of the perchlorate include ammonium perchlorate, methylamine perchlorate, propane polyamine perchlorate and triethylenetetramine perchlorate. Among the above, ammonium perchlorate is preferable.

The amount (concentration) of the perchlorate in the residue-removing solution is 0.1 to 10 wt %, preferably 0.3 to 5 wt %, and more preferably 0.5 to 3 wt %.

The residue-removing solution containing a perchlorate may further contain any of the neutral organic compounds having two or more oxygen atoms capable of coordinating to Cu and/or the monohydric alcohols with 4 or more carbon atoms, which are mentioned above in the section "Residue-Removing Solution (A)". This can enhance the effect of inhibiting Cu bulk corrosion and Cu surface cracking, as well as the effect of removing the residues after a dry process. The amount(s) of the neutral organic compound and/or the monohydric alcohol with 4 or more carbon atoms may also be as mentioned in the section "Residue-Removing Solution (C)".

The residue-removing solution of this embodiment of the invention may further contain a water-soluble base, a polycarboxylic acid salt, a surfactant, a fluorine compound, an antioxidant, a crack inhibitor, and the like. These components may be those mentioned in the section "Residue-Removing Solution (C)", and may be used in amounts mentioned therein.

The proportion of water contained in the residue-removing solution is typically about 40 to about 99.5 wt %, and preferably about 60 to about 99 wt %. The proportion of water can be determined according to the proportions of components other than water.

The pH of the residue-removing solution of the invention is 4 to 7. A pH of 4 or less tends to cause Cu corrosion, whereas a pH of more than 7 may damage the low-k film. The pH is preferably 4 to 6. The pH is adjusted with a base.

Specific examples of the residue-removing solution (D) of the invention are as follows.

In the case of a residue-removing solution containing a perchlorate, a Cu surface protective agent, and water; the amount of the perchlorate is about 0.1 to about 10 wt %, and preferably about 0.3 to about 5 wt %; the amount of the Cu surface protective agent is about 0.1 to about 1,000 ppm, and preferably 0.2 to 500 ppm; and the pH is about 4 to about 7, and preferably about 5 to about 7.

In the case of a residue-removing solution containing a perchlorate, a neutral organic compound and/or a monohydric alcohol with 4 or more carbon atoms, a Cu surface protective agent, and water; the amount of the perchlorate is about 0.1 to about 10 wt %, and preferably about 0.3 to about 5 wt %; the amount of the neutral organic compound and/or the monohydric alcohol with 4 or more carbon atoms is about 0.5 to about 60 wt %, and preferably about 2 to about 40 wt %; the amount of the Cu surface protective agent is about 0.2 to about 2,000 ppm, and preferably 0.5 to 1,000 ppm; and the pH is about 4 to about 7, and preferably about 5 to about 7.

In the case of a residue-removing solution containing a perchlorate, a neutral organic compound, a water-soluble base, a Cu surface protective agent, and water; the amount of the perchlorate is about 0.1 to about 10 wt %, and preferably about 0.3 to about 5 wt %; the amount of the neutral organic compound is about 0.5 to about 40 wt %, and preferably about 2 to about 30 wt %; the amount of the water-soluble base is about 0.5 to about 40 wt %, and preferably about 2 to about 30 wt %; the amount of the Cu surface protective agent is about 0.2 to about 2,000 ppm, and preferably 0.5 to 1,000 ppm; and the pH is about 4 to about 7, and preferably about 4 to about 6.

In the case of a residue-removing solution containing a perchlorate, a neutral organic compound, a polycarboxylic acid salt, a Cu surface protective agent, and water; the amount of the perchlorate is about 0.1 to about 10 wt %, and preferably about 0.3 to about 5 wt %; the amount of the neutral organic compound is about 0.5 to about 60 wt %, and preferably about 2 to about 40 wt %; the amount of the polycarboxylic acid salt is about 0.5 to about 20 wt %, and preferably about 0.75 to about 10 wt %; the amount of the Cu surface protective agent is about 0.5 to about 3,000 ppm, and preferably 1 to 2,000 ppm; and the pH is about 4 to about 7, and preferably about 4 to about 6.

Residues to be Removed

Principal targets of the residue-removing solution of the invention include the Cu oxide film and residues to be removed after a dry process; and the Cu surface to be protected.

Examples of a Cu oxide film include Cu oxide formed during dry etching and/or ashing; and a native oxide film of Cu resulting from oxidation of the metal when the substrate is exposed to air during transfer from one process to another. The compositions of these Cu oxide films include large amounts of $CuO$, $Cu_2O$, and $Cu(OH)_2$.

The residues after a dry process on a wafer on which a film is formed using Cu as a conductive metal are residues of Cu deterioration products including Cu oxide formed as a result of dry etching and/or ashing; and/or a Cu oxide film formed on the Cu surface of a Cu/low-k multilayer interconnect structure. These residues typically adhere to patterned Cu wiring, side walls of the pattern made of an interlayer dielectric such as a low-k film, and the surface of an interlayer dielectric substrate. The residue formed on the Cu is residue of a deterioration product of a mixture of the Cu and Cu oxide resulting from the oxidation and/or fluorination due to damage caused by dry etching and/or ashing. This residue has an increased electrical resistance. This Cu deterioration product is composed of Cu and Cu oxide that has been oxidized and/or fluorinated, and is therefore a dielectric layer having an electrical resistance close to that of Cu oxide.

The residues adhering to the side walls of the pattern made of an interlayer dielectric such as a low-k film include, in addition to the Cu deterioration product, residues of the stopper film such as SiN, low-k film, filling material, and the like sputtered by dry etching, and may contain Si and organic substances. The residue on the surface of the interlayer dielectric substrate can be assumed to include small amounts of Si and Cu deterioration product that jumped from the bottom of holes and trenches during dry etching, in addition to the residues of organic substances such as the resist, anti-reflection film, and filling material that have not been removed by ashing, and residue after a process using an inorganic mask.

The term "interlayer dielectric" as used herein principally means a low-k film and a porous low-k film, but also includes, for example, a fluorine-containing silicon oxide film (an FSG film). The term "interlayer dielectric" thus means a dielectric film having a dielectric constant of more than 1 and about 4 or less; preferably about 3 or less; more preferably about 2.8 or less; and still more preferably about 2.6 or less. The low-k film is typically produced by coating or plasma CVD.

Specific examples of low-k films include, but are not limited to: inorganic SOG films (HSG: hydrogenated silsesquioxane) such as LKD series (trade name; JSR Corporation), HSG series (trade name; Hitachi Chemical Co., Ltd.), Nanoglass (trade name; Honeywell), IPS (trade name; Catalysts and Chemicals Ind., Co., Ltd.), $Z_3M$ (trade name; Dow Corning), XLK (trade name; Dow Corning), FOx (trade name; Dow Corning), Orion (trade name; Tricon), NCS (trade name; Catalysts and Chemicals Ind., Co., Ltd.), and SiLK, porous-SiLK (trade name; Dow Corning); organic SOG films (MSQ film: methyl silsesquioxane film); coating films referred to as organic polymer films, principally composed of polyaryl ethers or the like; plasma CVD films represented by Black Diamond (trade name; Applied Materials), Coral (trade name; Novellus), and Aurora (trade name; ASM).

Examples of resists include, but are not limited to, KrF (Krypton F), ArF, and $F_2$ resists.

The filling material is typically an organic compound that also functions as an anti-reflection film.

II. Removal of Cu Oxide and/or Residues after Dry Process

The method for removing residues of the invention is a method for removing residues present on semiconductor substrates after a dry process (dry etching and/or ashing), typically in the formation processes of damascene, dual damascene, and like structures, as well as capacitor structures. More specifically, the method removes the residues present on semiconductor substrates with a Cu/low-k multilayer interconnect structure after a dry process, using the above-described residue-removing solution.

The invention also provides a method for manufacturing semiconductor devices. This method includes the steps of (1) subjecting a semiconductor substrate having Cu as an interconnect material, and a low-k film as an interlayer dielectric material, to dry etching and/or asking; and (2) bringing the semiconductor substrate processed in Step (1) into contact with the above-described residue-removing solution.

After the formation of a low-k film on a substrate, an insulating film barrier such as a SiN, SiC, TaN, or like film may be formed, as needed, on the low-k film, and etched together with the low-k film.

The residue-removing treatment is performed by bringing target semiconductor substrates into contact with the residue-removing solution. The method for bringing substrates into contact with the residue-removing solution is not limited as long as it can remove Cu oxide and/or residues after a dry process, inhibit Cu corrosion, and does not substantially damage the low-k film. The method can be suitably adjusted according to the type and temperature of the residue-removing solution. Various contact methods can be used; for example, a batch method wherein a large number of targets (wafers) housed in cassettes are immersed in a tank containing the chemical solution; a single-wafer method wherein cleaning is performed by applying the chemical solution onto the targets (wafers) being rotated; and a spraying method wherein cleaning is performed by continuously spraying the chemical solution toward the targets (wafers).

The temperature of the residue-removing solution is, for example, about 10 to about 60° C., and preferably about 15 to about 40° C. The contact time is not limited, and may be suitably selected; for example, the contact time is about 0.5 to about 60 minutes, and preferably about 1 to about 40 minutes.

In the batch method, wafers may be immersed, as required, in the residue-removing solution being stirred. The stirring speed is not limited, and may be suitably selected. When unwanted substances are difficult to remove, the targets may be immersed in the residue-removing solution and subjected to, for example, ultrasonic cleaning.

The method for removing Cu oxide of the invention may further include cleaning with pure water the wafers from which Cu oxide and/or residues after a dry process have been removed. The residue-removing solution containing a Cu surface protective agent of the invention can be rinsed by this cleaning step.

Semiconductor substrates from which Cu oxide and/or residues after a dry process have been removed using the residue-removing solution of the invention containing a Cu surface protective agent, can be processed into various types of semiconductor devices, according to conventional processes such as the formation of Cu interconnects (for example, the process described in Details of Semiconductor CMP Technology; written and edited by Toshiro DOI, 2001).

In the subsequent process such as sputtering after cleaning or a newly added desorption process, the Cu surface protective agent adhering to the Cu surface can be desorbed from a semiconductor substrate by heating the substrate to 180° C. or more, and preferably about 200 to about 300° C., in an inert gas or vacuum atmosphere.

EXAMPLES

Examples are given below to clarify the features of the present invention. The invention, however, is by no means limited to these Examples.

In order to examine the degrees of Cu oxidation, Cu cracking, and Cu surface roughness after treatment with the residue-removing solution for use after a dry process containing a Cu surface protective agent, wafers with test patterns having a Cu/low-k dual damascene structure formed by the via-first process were used. The low-k film of the Cu/low-k dual damascene structure was a SiOC film formed by plasma CVD, and the insulating film barrier was a SiN film. Residues after a dry process were present in large amounts at the bottoms of via holes, and observed in small amounts on the side walls of the via holes and on the surface of the low-k substrate. The Cu surfaces of the samples had been damaged by a dry process, and hence, were susceptible to cracking, surface roughness, and the like due to a chemical treatment.

The residue-removing treatment after a dry process was performed as follows. The wafers with test patterns were immersed with stirring (at about 600 rpm) in the chemical solutions at 25° C. shown in the Examples and Comparative Examples for 1 to 3 minutes. The immersed wafers were then rinsed under running ultrapure water and dried.

After the residue-removing treatment, 12 via holes were examined with an electron microscope (SEM) for their cross-sectional shape and state of residue-removal after a dry process. Moreover, in order to determine the state of Cu surface roughness and the presence or absence of cracks on the Cu surface, 60 via holes were examined under an electron microscope (SEM). Where necessary, a cross-section of the via holes was examined under an SEM.

Furthermore, in order to examine damage to the Cu and low-k films, which is difficult to detect in evaluations using the wafers with test patterns, blanket wafers having Cu and low-k films thereon were immersed in the chemical solutions of the Examples and Comparative Examples for 10 minutes, and then the etching rates were determined. In order to examine changes in their surface conditions, the low-k films were measured for their contact angles before and after immersion in the chemical solutions, and the contact angles were compared. It has been found, according to thermal desorption spectroscopy (TDS), that there is a correlation that the greater the change in contact angle, the greater the amount of water adsorption. That is to say, the change in contact angle reflects the change in the outermost surface of the low-k film. The contact angle was measured using a contact angle meter.

Additionally, Cu blanket wafers immersed in the chemical solutions were maintained in air (25° C., 40% RH), and the state of Cu oxidation was determined. The rates of the growth of Cu oxide films were examined by observing Cu peaks originating from CuO using XPS (X-ray photoelectron spectroscopy), and comparing the results.

The fluorine compound and Cu surface protective agents 1 to 3 used in the chemical solutions of Examples and Comparative Examples were as follows.

fluorine compound: $NH_4F$

Cu surface protective agent 1: indazole (by ACROS ORGANICS)

Cu surface protective agent 2: 2-mercaptobenzothiazole (by ACROS ORGANICS)

Cu surface protective agent 3: 2,4,6-triaminopyrimidine (by ACROS ORGANICS)

Tables 2 to 12 show the samples of Examples, and Tables 12 to 15 show the samples of Comparative Examples. Table 1 presents the determination criteria for the test results.

TABLE 1

| | | Evaluations Using the Patterned Wafers | | | | | Evaluations Using the Blanket Films | | |
|---|---|---|---|---|---|---|---|---|---|
| | | Residue-Removing Performance | Via Hole Pattern Shapes (Immersion Time in the Chemical Solutions: 3 min) | | | Cu | | Low-k Film (SiOC Film) | |
| | | Via Holes | | | | Oxidation | | Surface Layer Deterioration | |
| Criteria | | Cu Surface Side Walls Substrate Surface Residue Removal Time | Cu Surface Roughness | Side Walls Surface Condition | Cu Surface Cracking (*) | XPS Time until Cu Peak of CuO Is Produced | Corrosion Etching Etching Rate | Change in Contact Angle | |
| Determination | Best | A: 1 min or less | A: no erosion | | A: no cracks | A: 1 week or more | A: 1 Å/min or less | A: 1° or less | |
| | Good | B: 1-2 min | B: no erosion problems | | B: 3 or less shallow cracks | B: 1 week or less | B: 1-2 Å/min | B: 1-3° | |
| | Partially Defective | C: 2-3 min | C: a low degree of roughness | | C: 5 or less | C: 3 days or less surface | C: 2-3 Å/min | C: 3-5° cracks | |
| | Defective | D: 3 min or more | D: erosion | | D: 5 or more deep cracks | D: 24 hr or less more | D: 3 Å/min or more | D: 5° or more | |

(*) The term "shallow cracks" denotes cracks with a width and depth of less than about 10 nm; the term "deep cracks" means cracks with a width and depth of more than about 20 nm; and the term "normal cracks" denotes cracks with a width and depth of about 10 to about 20 nm.

Examples 1 to 27

Chemical solutions of Examples 1 to 27 were prepared according to the compositions and proportions listed in Table 2. The pH was adjusted to about 6.5. Table 3 shows the results of the tests using the chemical solutions of Examples 1 to 27.

TABLE 2

Composition of Residue-Removing Solution

| | Water | Composition of Aldehyde Acid Salt and/or Keto Acid Salt | | | | Fluorine Compound | | | Cu Surface Protective Agent | | |
|---|---|---|---|---|---|---|---|---|---|---|---|
| Ex. | (% by Weight) | Aldehyde Acid and/or Keto Acid | (% by Weight) | Base | (% by Weight) | (% by Weight) | Organic Solvent | (% by Weight) | 1 (ppm) | 2 (ppm) | 3 (ppm) |
| 1 | 98.5 | Glyoxylic Acid | 1.2 | Ammonia | 0.3 | | | | | 1 | |
| 2 | 98.2 | Glyoxylic Acid | 1.2 | Methylamine | 0.5 | | | | 0.5 | 0.5 | |
| 3 | 98.0 | Glyoxylic Acid | 1.2 | Ethylamine | 0.8 | | | | | 1 | 100 |
| 4 | 97.0 | Glyoxylic Acid | 1.2 | Butylamine | 1.2 | 0.5 | | | | 0.5 | 100 |
| 5 | 97.0 | Glyoxylic Acid | 1.2 | Diethylamine | 1.2 | 0.5 | | | | 0.5 | |
| 6 | 96.7 | Glyoxylic Acid | 1.2 | Tetramethylammonium Hydroxide | 1.5 | 0.5 | | | | 1 | |
| 7 | 96.7 | Glyoxylic Acid | 1.2 | Choline | 2.0 | | | | | 3 | |
| 8 | 97.8 | Levulinic Acid | 1.9 | Ammonia | 0.3 | | | | 3 | | |
| 9 | 97.0 | Levulinic Acid | 1.9 | Methylamine | 0.5 | 0.5 | | | 1 | | |
| 10 | 96.8 | Levulinic Acid | 1.9 | Ethylamine | 0.8 | 0.5 | | | 2 | | |
| 11 | 96.3 | Levulinic Acid | 1.9 | Butylamine | 1.2 | 0.5 | | | 3 | | |
| 12 | 96.3 | Levulinic Acid | 1.9 | Diethylamine | 1.2 | 0.5 | | | 0.5 | | |
| 13 | 96.5 | Levulinic Acid | 1.9 | Tetramethylammonium Hydroxide | 1.5 | | | | 2 | | |
| 14 | 96.0 | Levulinic Acid | 1.9 | Choline | 2.0 | | | | 1 | | |
| 15 | 97.0 | α-Ketoglutaric Acid | 2.4 | Ammonia | 0.6 | | | | 3 | | |
| 16 | 96.5 | α-Ketoglutaric Acid | 2.4 | Methylamine | 1.0 | | | | | 1 | |
| 17 | 96.1 | α-Ketoglutaric Acid | 2.4 | Ethylamine | 1.5 | | | | | 1 | 100 |
| 18 | 94.6 | α-Ketoglutaric Acid | 2.4 | Butylamine | 2.4 | 0.5 | | | | 0.5 | 100 |
| 19 | 94.6 | α-Ketoglutaric Acid | 2.4 | Diethylamine | 2.4 | 0.5 | | | 0.5 | | |
| 20 | 94.0 | α-Ketoglutaric Acid | 2.4 | Tetramethylammonium Hydroxide | 3.0 | 0.5 | | | 1 | | |

TABLE 2-continued

Composition of Residue-Removing Solution

| Ex. | Water (% by Weight) | Aldehyde Acid and/or Keto Acid | (% by Weight) | Base | (% by Weight) | Fluorine Compound (% by Weight) | Organic Solvent | (% by Weight) | Cu Surface Protective Agent 1 (ppm) | 2 (ppm) | 3 (ppm) |
|---|---|---|---|---|---|---|---|---|---|---|---|
| 21 | 93.5 | α-Ketoglutaric Acid | 2.4 | Choline | 4.0 | | | | 3 | | |
| 22 | 47.3 | Levulinic Acid | 1.9 | Ammonia | 0.3 | 0.5 | Diethylene Glycol Monoethyl Ether Acetate | 50 | | 2 | |
| 23 | 56.9 | Levulinic Acid | 1.9 | Methylamine | 0.5 | 0.5 | Diethylene Gycol | 40 | 1000 | | |
| 24 | 66.8 | Levulinic Acid | 1.9 | Ethylamine | 0.8 | 0.5 | Triethylene Glycol Dimethyl Ether | 30 | 100 | | |
| 25 | 76.3 | Levulinic Acid | 1.9 | Butylamine | 1.2 | 0.5 | Triethylene Glycol Monomethyl Ether | 20 | 50 | | |
| 26 | 86.8 | Levulinic Acid | 1.9 | Diethylamine | 1.2 | | Ethylene Glycol Diacetate | 10 | 10 | | |
| 27 | 91.5 | Levulinic Acid | 1.9 | Tetramethylammonium Hydroxide | 1.5 | | Propylene Carbonate | 5 | | 1 | 100 |

TABLE 3

| | Evaluations Using the Patterned Wafers | | | | | | Evaluations Using the Blanket Films | | |
|---|---|---|---|---|---|---|---|---|---|
| | Residue-Removing Performance | | | Evaluation of Via Hole Pattern Shapes (Immersion Time in the Chemical Solutions: 3 min) | | | Cu | | Low-k Film (SiOC Film) Surface Layer Deterioration |
| Ex. | Cu Surface on Via Hole Bottom | Via Hole Side Walls | Substrate Surface | Cu Surface Roughness | Cu Surface Cracking | Via Hole Side Walls | Oxidation XPS | Corrosion Etching Rate | Change in Contact Angle |
| 1 | A | A | A | B | A | A | A | B | A | A |
| 2 | A | A | A | A | A | A | A | A | A | A |
| 3 | A | A | A | A | A | A | A | A | A | A |
| 4 | A | A | A | A | A | A | A | A | A | A |
| 5 | A | A | A | B | A | A | A | A | A | A |
| 6 | A | A | A | B | A | A | A | A | A | A |
| 7 | A | A | A | A | A | A | A | A | A | A |
| 8 | A | A | A | A | A | A | A | A | A | A |
| 9 | A | A | A | A | A | A | A | A | A | A |
| 10 | A | A | A | A | A | A | A | A | A | A |
| 11 | A | A | A | A | A | A | A | A | A | A |
| 12 | A | A | A | A | A | A | A | A | A | A |
| 13 | A | A | A | A | A | A | A | A | A | A |
| 14 | A | A | A | A | A | A | A | A | A | A |
| 15 | A | A | A | A | A | A | A | A | A | A |
| 16 | A | A | A | A | A | A | A | A | A | A |
| 17 | A | A | A | A | A | A | A | A | A | A |
| 18 | A | A | A | A | A | A | A | A | A | A |
| 19 | A | A | A | A | A | A | A | A | A | A |
| 20 | A | A | A | A | A | A | A | A | A | A |
| 21 | A | A | A | A | A | A | A | A | A | A |
| 22 | A | A | A | B | A | A | A | A | A | A |
| 23 | A | A | A | A | A | A | A | A | A | A |
| 24 | A | A | A | A | A | A | A | A | A | A |
| 25 | A | A | A | A | A | A | A | A | A | A |
| 26 | A | A | A | A | A | A | A | A | A | A |
| 27 | A | A | A | A | A | A | A | A | A | A |

Examples 28 to 41

Chemical solutions of Examples 28 to 41 were prepared according to the compositions and proportions listed in Table 4.

Table 5 shows the results of the tests using the chemical solutions of Examples 28 to 41. The pH was adjusted to about 5.

TABLE 4

Composition of Residue-Removing Solution

| Ex. | Water (% by Weight) | Aldehyde Acid and/or Keto Acid | (% by Weight) | Polycarboxylic Acid Salt Composition — Polycarboxylic Acid | (% by Weight) | Base | (% by Weight) | Fluorine Compound (% by Weight) | Organic Solvent | (% by Weight) | Cu Surface Protective Agent 1 (ppm) | 2 (ppm) | 3 (ppm) |
|---|---|---|---|---|---|---|---|---|---|---|---|---|---|
| 28 | 98.7 | Pyruvic Acid | 0.8 | Malonic Acid | 1.5 | Ammonia | 0.5 | | | | 1 | 1 | |
| 29 | 98.3 | Pyruvic Acid | 0.8 | Malonic Acid | 1.5 | Methylamine | 0.9 | | | | | 1 | |
| 30 | 97.0 | Pyruvic Acid | 0.8 | Malonic Acid | 1.5 | Diethylamine | 2.1 | 0.1 | | | | 1 | 100 |
| 31 | 96.5 | Pyruvic Acid | 0.8 | Malonic Acid | 1.5 | Tetramethyl-ammonium Hydroxide | 2.6 | 0.1 | | | 0.5 | 0.5 | |
| 32 | 99.2 | α-Keto-glutaric Acid | 0.3 | Citric Acid | 1.4 | Ammonia | 0.4 | 0.1 | | | 1 | 1 | |
| 33 | 98.9 | α-Keto-glutaric Acid | 0.3 | Citric Acid | 1.4 | Methylamine | 0.7 | 0.1 | | | | 3 | |
| 34 | 98.1 | α-Keto-glutaric Acid | 0.3 | Citric Acid | 1.4 | Diethylamine | 1.6 | | | | | 1 | 100 |
| 35 | 97.7 | α-Keto-glutaric Acid | 0.3 | Citric Acid | 1.4 | Tetramethyl-ammonium Hydroxide | 2.0 | | | | 0.5 | 0.5 | |
| 36 | 48.4 | Levulinic Acid | 1.0 | Malonic Acid | 1.5 | Ammonia | 0.5 | 0.1 | Diethylene Glycol Monoethyl Ether Acetate | 50 | | 2 | |
| 37 | 58.0 | Levulinic Acid | 1.0 | Malonic Acid | 1.5 | Methylamine | 0.9 | 0.1 | Diethylene Glycol | 40 | 1000 | | |
| 38 | 67.6 | Levulinic Acid | 1.0 | Malonic Acid | 1.5 | Ethylamine | 1.3 | 0.1 | Triethylene Glycol Dimethyl Ether | 30 | 100 | | |
| 39 | 76.8 | Levulinic Acid | 1.0 | Malonic Acid | 1.5 | Butylamine | 2.1 | 0.1 | Triethylene Glycol Monomethyl Ether | 20 | 50 | | |
| 40 | 86.9 | Levulinic Acid | 1.0 | Malonic Acid | 1.5 | Diethylamine | 2.1 | 0.1 | Ethylene Glycol Diacetate | 10 | 10 | 1 | |
| 41 | 91.3 | Levulinic Acid | 1.0 | Malonic Acid | 1.5 | Tetramethyl-ammonium Hydroxide | 2.6 | | Propylene Carbonate | 5 | | 1 | 100 |

TABLE 5

| | Evaluations Using the Patterned Wafers | | | | | | Evaluations Using the Blanket Films | | | |
|---|---|---|---|---|---|---|---|---|---|---|
| | Residue-Removing Performance | | | Evaluation of Via Hole Pattern Shapes (Immersion Time in the Chemical Solutions: 3 min) | | | Cu | | | Low-k Film (SiOC Film) Surface Layer Deterioration |
| Ex. | Cu Surface on Via Hole Bottom | Via Hole Side Walls | Substrate Surface | Cu Surface Roughness | Cu Surface Cracking | Via Hole Side Walls | Oxidation XPS | Corrosion Etching Rate | Etching Rate | Change in Contact Angle |
| 28 | A | A | A | A | A | A | A | A | A | A |
| 29 | A | A | A | B | A | A | A | A | A | A |
| 30 | A | A | A | A | A | A | A | A | A | A |

TABLE 5-continued

| | Evaluations Using the Patterned Wafers | | | | | | Evaluations Using the Blanket Films | | | |
|---|---|---|---|---|---|---|---|---|---|---|
| | | | | Evaluation of Via Hole Pattern Shapes | | | | | Low-k Film (SiOC Film) | |
| | Residue-Removing Performance | | | (Immersion Time in the Chemical Solutions: 3 min) | | | Cu | | | Surface Layer Deterioration |
| Ex. | Cu Surface on Via Hole Bottom | Via Hole Side Walls | Substrate Surface | Cu Surface Roughness | Cu Surface Cracking | Via Hole Side Walls | Oxidation XPS | Corrosion Etching Rate | Etching | Change in Contact Angle |
| 31 | A | A | A | A | A | A | A | A | A | A |
| 32 | A | A | A | A | A | A | A | A | A | A |
| 33 | A | A | A | A | A | A | A | A | A | A |
| 34 | A | A | A | A | A | A | A | A | A | A |
| 35 | A | A | A | A | A | A | A | A | A | A |
| 36 | A | A | A | B | A | A | A | A | A | A |
| 37 | A | A | A | A | A | A | A | A | A | A |
| 38 | A | A | A | A | A | A | B | A | A | A |
| 39 | A | A | A | A | A | A | B | A | A | A |
| 40 | A | A | A | A | A | A | A | A | A | A |
| 41 | A | A | A | A | A | A | A | A | A | A |

Examples 42 to 53

Chemical solutions of Examples 42 to 53 were prepared according to the compositions and proportions listed in Table 6.

Table 7 shows the results of the tests using the chemical solutions of Examples 42 to 53.

TABLE 6

| | Composition of Residue-Removing Solution | | | | | |
|---|---|---|---|---|---|---|
| | Water | | Polycarboxylic Acid Salt Composition | | | |
| Ex. | (% by Weight) | Acid | % by Weight | Polycarboxylic Acid | (% by Weight) | Basic Compound | (% by Weight) |
| 42 | 96.9 | Trifluoroacetic Acid | 1.0 | Malonic Acid | 1.5 | Ammonia | 0.5 |
| 43 | 96.1 | Trifluoroacetic Acid | 1.0 | Malonic Acid | 1.5 | Ethylamine | 1.3 |
| 44 | 95.4 | Trifluoroacetic Acid | 1.0 | Malonic Acid | 1.5 | Diethylamine | 2.1 |
| 45 | 94.9 | Trifluoroacetic Acid | 1.0 | Malonic Acid | 1.5 | Tetramethylammonium Hydroxide | 2.6 |
| 46 | 97.8 | Trifluoroacetic Acid | 1.0 | Malonic Acid | 0.9 | Ammonia | 0.3 |
| 47 | 95.6 | Trifluoroacetic Acid | 1.0 | Malonic Acid | 2.6 | Ammonia | 0.8 |
| 48 | 46.9 | Trifluoroacetic Acid | 1.0 | Malonic Acid | 1.5 | Ammonia | 0.5 |
| 49 | 56.9 | Trifluoroacetic Acid | 1.0 | Malonic Acid | 1.5 | Ammonia | 0.5 |
| 50 | 66.9 | Trifluoroacetic Acid | 1.0 | Malonic Acid | 1.5 | Ammonia | 0.5 |
| 51 | 76.9 | Trifluoroacetic Acid | 1.0 | Malonic Acid | 1.5 | Ammonia | 0.5 |
| 52 | 87.0 | Trifluoroacetic Acid | 1.0 | Malonic Acid | 1.5 | Ammonia | 0.5 |
| 53 | 92.0 | Trifluoroacetic Acid | 1.0 | Malonic Acid | 1.5 | Ammonia | 0.5 |

| | Composition of Residue-Removing Solution | | | | | | | |
|---|---|---|---|---|---|---|---|---|
| | Fluorine Compound | | | Acid:Polycarboxylic Acid Salt Molar Ratio | | Cu Surface Protective Agent | | |
| Ex. | (% by Weight) | Organic Solvent | % by Weight | | pH | 1 (ppm) | 2 (ppm) | 3 (ppm) |
| 42 | 0.1 | — | 0 | 0.61 | 5 | 1 | 1 | |
| 43 | 0.1 | — | 0 | 0.61 | 5 | | 2 | |
| 44 | | — | 0 | 0.61 | 5 | | 1 | 100 |
| 45 | | — | 0 | 0.61 | 5 | 0.5 | 0.5 | |

TABLE 6-continued

| | | | | | | | |
|---|---|---|---|---|---|---|---|
| 46 | | — | 0 | 1.00 | 4 | 3 | |
| 47 | | — | 0 | 0.35 | 5.5 | 1 | 100 |
| 48 | 0.1 | Diethylene Glycol Monoethyl Ether Acetate | 50 | 0.61 | 5 | 2 | |
| 49 | 0.1 | Diethylene Glycol | 40 | 0.61 | 5 | 1000 | |
| 50 | 0.1 | Triethylene Glycol Dimethyl Ether | 30 | 0.61 | 5 | 100 | |
| 51 | 0.1 | Triethylene Glycol Monomethyl Ether | 20 | 0.61 | 5 | 50 | |
| 52 | | Ethylene Glycol Diacetate | 10 | 0.61 | 5 | 10 | 1 |
| 53 | | Propylene Carbonate | 5 | 0.61 | 5 | 1 | 100 |

TABLE 7

| | Evaluations Using the Patterned Wafers | | | | | | Evaluations Using the Blanket Films | | | |
|---|---|---|---|---|---|---|---|---|---|---|
| | Residue-Removing Performance | | | Evaluation of Via Hole Pattern | | | Low-k Film (SiOC Film) | | | Surface Layer Deterioration |
| | | | | Shapes (Immersion Time in the Chemical Solutions: 3 min) | | | | | | |
| | Cu Surface | | | | Cu | | Cu | | | Change |
| Ex. | on Via Hole Bottom | Via Hole Side Walls | Substrate Surface | Cu Surface Roughness | Surface Cracking | Via Hole Side Walls | Oxidation XPS | Corrosion Etching Rate | Etching | in Contact Angle |
| 42 | A | A | A | A | A | A | A | A | A | A |
| 43 | A | A | A | B | A | A | A | A | A | A |
| 44 | A | A | A | A | A | A | A | A | A | A |
| 45 | A | A | A | A | A | A | A | A | A | A |
| 46 | A | A | B | A | A | A | A | A | A | A |
| 47 | A | A | B | A | A | A | A | B | A | A |
| 48 | A | A | A | B | A | A | A | A | A | A |
| 49 | A | A | A | A | A | A | A | A | A | A |
| 50 | A | A | A | A | A | A | B | A | A | A |
| 51 | A | A | A | A | A | A | B | A | A | A |
| 52 | A | A | A | A | A | A | A | A | A | A |
| 53 | A | A | A | A | A | A | A | A | A | A |

Examples 54 to 86

Chemical solutions of Examples 54 to 86 were prepared according to the compositions and proportions listed in Table 8.

Table 9 shows the results of the tests using the chemical solutions of Examples 54 to 86.

TABLE 8

| | Composition of Residue-Removing Solution | | | | | | |
|---|---|---|---|---|---|---|---|
| | Water | | | | | Polycarboxylic Acid Salt Composition | |
| Ex. | (% by Weight) | Organic Solvent | (% by Weight) | Basic Compound | (% by Weight) | Polycarboxylic Acid | (% by Weight) |
| 54 | 96.4 | 2,3-Butanedione | 3.6 | | 0 | | 0 |
| 55 | 95.8 | Acetoin | 3.7 | | 0 | | 0 |
| 56 | 96.4 | 1-Butanol | 3.1 | | 0 | | 0 |
| 57 | 95.1 | Diethylene Glycol | 4.4 | | 0 | | 0 |
| 58 | 93.7 | Triethylene Glycol | 6.3 | | 0 | | 0 |

TABLE 8-continued

| | | | | | | | |
|---|---|---|---|---|---|---|---|
| 59 | 91.4 | Tetraethylene Glycol | 8.1 | | 0 | | 0 |
| 60 | 92.1 | Triethylene Glycol Dimethyl Ether | 7.4 | | 0 | | 0 |
| 61 | 93.2 | Tetraethylene Glycol Dimethyl Ether | 6.8 | | 0 | | 0 |
| 62 | 94.6 | Ethylene Glycol Monomethyl Ether Acetate | 4.9 | | 0 | | 0 |
| 63 | 93.4 | Ethylene Glycol Diacetate | 6.1 | | 0 | | 0 |
| 64 | 94.5 | Propylene Glycol Monoethyl Ether Acetate | 5.5 | | 0 | | 0 |
| 65 | 92.2 | Diethylene Glycol Monoethyl Ether Acetate | 7.3 | | 0 | | 0 |
| 66 | 94.4 | Diethylene Glycol Monomethyl Ether | 5.6 | | 0 | | 0 |
| 67 | 92.7 | Triethylene Glycol Monomethyl Ether | 6.8 | | 0 | | 0 |
| 68 | 91.4 | Tripropylene Glycol Monomethyl Ether | 8.6 | | 0 | | 0 |
| 69 | 95.7 | Propylene Carbonate | 4.3 | | 0 | | 0 |
| 70 | 94.7 | Methyl Acetoacetate | 4.8 | | 0 | | 0 |
| 71 | 95.2 | Ethyl Glycolate | 4.3 | | 0 | | 0 |
| 72 | 95.1 | Ethyl Lactate | 4.9 | | 0 | | 0 |
| 73 | 94.6 | Dimethyl Oxalate | 4.9 | | 0 | | 0 |
| 74 | 93.9 | Diethyl Oxalate | 6.1 | | 0 | | 0 |
| 75 | 94.0 | Dimethyl Malonate | 5.5 | | 0 | | 0 |
| 76 | 93.3 | Diethyl Malonate | 6.7 | | 0 | | 0 |
| 77 | 96.5 | Dimethyl Oxalate | 2.0 | Diethylamine | 1.00 | | 0 |
| 78 | 96.6 | Diethyl Oxalate | 2.4 | Diethylamine | 1.00 | | 0 |
| 79 | 96.5 | Dimethyl Malonate | 2.2 | Diethylamine | 0.75 | | 0 |
| 80 | 96.7 | Diethyl Malonate | 2.7 | Diethylamine | 0.60 | | 0 |
| 81 | 97.3 | Methyl Pyruvate | 1.7 | Diethylamine | 1.00 | | 0 |
| 82 | 95.8 | Dimethyl Malonate | 2.2 | | 0 | Malonic Acid | 1.5 |
| 83 | 95.8 | Diethyl Malonate | 2.7 | | 0 | Malonic Acid | 1.5 |
| 84 | 97.1 | Dimethyl Oxalate | 1.0 | | 0 | Malonic Acid | 1.5 |
| 85 | 97.3 | Diethyl Oxalate | 1.2 | | 0 | Malonic Acid | 1.5 |
| 86 | 97.1 | Methyl Pyruvate | 0.9 | | 0 | Malonic Acid | 1.5 |

| | Composition of Residue-Removing Solution | | | | |
|---|---|---|---|---|---|
| | Polycarboxylic Acid Salt Composition | | Fluorine Compound | Cu Surface Protective Agent | | |
| Ex. | Basic Compound | (% by Weight) | (% by Weight) | 1 (ppm) | 2 (ppm) | 3 (ppm) |
| 54 | | 0 | | 2 | | |
| 55 | | 0 | 0.5 | 2 | | |
| 56 | | 0 | 0.5 | 1 | | |
| 57 | | 0 | 0.5 | 1 | 1 | |
| 58 | | 0 | | 1 | 1 | |
| 59 | | 0 | 0.5 | 1 | 1 | 100 |
| 60 | | 0 | 0.5 | 0.5 | | |
| 61 | | 0 | | 1 | | |
| 62 | | 0 | 0.5 | 1 | | |
| 63 | | 0 | 0.5 | 2 | | |
| 64 | | 0 | | 3 | | |
| 65 | | 0 | 0.5 | 3 | | |
| 66 | | 0 | | 1 | 1 | |
| 67 | | 0 | 0.5 | 1 | 1 | |
| 68 | | 0 | | 3 | | |
| 69 | | 0 | | 2 | | |
| 70 | | 0 | 0.5 | 1 | | |
| 71 | | 0 | 0.5 | | 3 | |
| 72 | | 0 | | | 3 | |
| 73 | | 0 | 0.5 | | 1 | 100 |
| 74 | | 0 | | | 1 | |
| 75 | | 0 | 0.5 | 2 | | |
| 76 | | 0 | | 2 | | |
| 77 | | 0 | 0.5 | 2 | 1 | |
| 78 | | 0 | | 2 | 1 | |
| 79 | | 0 | 0.5 | 1 | | |

TABLE 8-continued

|    |          |     |     |   |     |
|----|----------|-----|-----|---|-----|
| 80 |          | 0   |     | 1 |     |
| 81 |          | 0   |     | 3 |     |
| 82 | Ammonia  | 0.5 | 0.5 | 1 |     |
| 83 | Ammonia  | 0.5 |     | 1 | 100 |
| 84 | Ammonia  | 0.5 | 0.5 | 1 | 1   |
| 85 | Ammonia  | 0.5 |     | 2 |     |
| 86 | Ammonia  | 0.5 | 0.5 | 2 |     |

TABLE 9

| | Evaluations Using the Patterned Wafers | | | | | | Evaluations Using the Blanket Films | | | |
|---|---|---|---|---|---|---|---|---|---|---|
| | | | | Evaluation of Via Hole Pattern Shapes | | | | | | Low-k Film (SiOC Film) |
| | Residue-Removing Performance | | | (Immersion Time in the Chemical Solutions: 3 min) | | | Cu | | | Surface Layer Deterioration |
| Ex. | Cu Surface on Via Hole Bottom | Via Hole Side Walls | Substrate Surface | Cu Surface Roughness | Cu Surface Cracking | Via Hole Side Walls | Oxidation XPS | Corrosion Etching Rate | Etching | Change in Contact Angle |
| 54 | A | A | A | A | A | A | A | A | A | A |
| 55 | A | A | A | A | A | A | A | A | A | A |
| 56 | B | B | A | A | A | A | A | A | A | A |
| 57 | A | A | A | B | B | A | A | A | A | A |
| 58 | A | A | A | B | B | A | A | A | A | A |
| 59 | A | A | A | A | B | A | A | A | A | A |
| 60 | A | B | A | A | A | A | A | A | A | A |
| 61 | A | B | A | A | A | A | A | A | A | A |
| 62 | A | A | A | A | A | A | A | A | A | A |
| 63 | A | A | A | A | A | A | A | A | A | A |
| 64 | A | A | A | A | A | A | A | A | A | A |
| 65 | A | A | A | A | A | A | A | A | A | A |
| 66 | A | A | A | A | A | A | A | A | A | A |
| 67 | A | A | A | A | A | A | A | A | A | A |
| 68 | A | A | A | A | A | A | A | A | A | A |
| 69 | B | B | A | A | A | A | A | A | A | A |
| 70 | A | A | A | A | A | A | A | A | A | A |
| 71 | A | A | A | A | A | A | A | A | A | A |
| 72 | A | A | A | A | A | A | A | A | A | A |
| 73 | A | A | A | A | A | A | A | B | A | A |
| 74 | A | A | A | B | A | A | A | B | A | A |
| 75 | A | A | A | A | A | A | A | A | A | A |
| 76 | A | A | A | A | A | A | A | A | A | A |
| 77 | A | A | A | A | A | A | A | A | A | A |
| 78 | A | A | A | A | A | A | A | A | A | A |
| 79 | A | B | A | A | A | A | A | A | A | A |
| 80 | A | B | A | A | A | A | A | A | A | A |
| 81 | A | A | A | A | A | A | A | A | A | A |
| 82 | A | A | A | B | A | A | A | A | A | A |
| 83 | A | A | A | A | A | A | A | A | A | A |
| 84 | A | A | A | A | A | A | A | A | A | A |
| 85 | A | A | A | A | A | A | A | A | A | A |
| 86 | A | A | A | A | A | A | A | A | A | A |

Examples 87 to 94

Chemical solutions of Examples 87 to 94 were prepared according to the compositions and proportions listed in Table 10.

Table 11 shows the results of the tests using the chemical solutions of Examples 87 to 94.

TABLE 10

| | Composition of Residue-Removing Solution | | | | | | | | | |
|---|---|---|---|---|---|---|---|---|---|---|
| | Water | | | | | | Fluorine Compound | Cu Surface Protective Agent | | |
| Ex. | (% by Weight) | Perchlorate | (% by Weight) | Neutral Organic Solvent | (% by Weight) | Water-Soluble Base | (% by Weight) | (% by Weight) | 1 (ppm) | 2 (ppm) | 3 (ppm) |
| 87 | 98.5 | Ammonium Perchlorate | 1 | — | 0 | | | 0.5 | 2 | | |

TABLE 10-continued

Composition of Residue-Removing Solution

| Ex. | Water (% by Weight) | Perchlorate | (% by Weight) | Neutral Organic Solvent | (% by Weight) | Water-Soluble Base | (% by Weight) | Fluorine Compound (% by Weight) | Cu Surface Protective Agent 1 (ppm) | 2 (ppm) | 3 (ppm) |
|---|---|---|---|---|---|---|---|---|---|---|---|
| 88 | 97.0 | Ammonium Perchlorate | 1 | 1-Butanol | 1.5 | | | 0.5 | 1 | | |
| 89 | 95.2 | Ammonium Perchlorate | 1 | Diethyl Malonate | 2.7 | Ethylamine | 0.6 | 0.5 | | 2 | |
| 90 | 92.1 | Ammonium Perchlorate | 3 | Diethylene Glycol Monoethyl Ether Acetate | 7.3 | | 0 | 0.5 | 2 | | |
| 91 | 89.1 | Ammonium Perchlorate | 3 | Diethylene Glycol | 4.4 | | 0 | 0.5 | 1 | 1 | |
| 92 | 89.7 | Ammonium Perchlorate | 3 | Triethylene Glycol Dimethyl Ether | 7.4 | | 0 | 0.5 | 1 | 1 | 100 |
| 93 | 92.1 | Ammonium Perchlorate | 3 | Triethylene Glycol Monomethyl Ether | 6.8 | | 0 | 0.5 | | 1 | 100 |
| 94 | 90.4 | Ammonium Perchlorate | 3 | Ethylene Glycol Diacetate | 6.1 | | 0 | 0.5 | | 2 | |

TABLE 11

| | Evaluations Using the Patterned Wafers | | | | | | Evaluations Using the Blanket Films | | | |
|---|---|---|---|---|---|---|---|---|---|---|
| | Residue-Removing Performance | | | Evaluation of Via Hole Pattern Shapes (Immersion Time in the Chemical Solutions: 3 min) | | | Cu | | | Low-k Film (SiOC Film) Surface Layer Deterioration |
| Ex. | Cu Surface on Via Hole Bottom | Via Hole Side Walls | Substrate Surface | Cu Surface Roughness | Cu Surface Cracking | Via Hole Side Walls | Oxidation XPS | Corrosion Etching | Etching Rate | Change in Contact Angle |
| 87 | A | A | A | A | A | A | A | A | A | A |
| 88 | A | A | A | A | A | A | A | A | A | A |
| 89 | A | B | A | B | A | A | A | A | A | A |
| 90 | A | A | A | A | A | A | A | A | A | A |
| 91 | A | A | A | A | B | A | A | A | A | A |
| 92 | A | A | A | A | A | A | A | A | A | A |
| 93 | A | A | A | A | A | A | A | A | A | A |
| 94 | A | A | A | A | A | A | A | A | A | A |

The results of the evaluations using the wafers with test patterns shown in Table 2 to 11 show that the residue-removing solutions of Examples 1 to 94 exhibit excellent residue-removing performance. These solutions caused neither a change in the pattern shapes, nor Cu surface roughness or minute cracking of the Cu surfaces, and were also capable of preventing Cu oxidation.

The results of the evaluations using the blanket wafers show that the residue-removing solutions cause neither Cu corrosion nor damage to low-k films, because the etching rates for Cu and low-k films were low, and the contact angles of the low-k films also did not change.

In Examples 1 to 7, similar effects were attained when a pyruvic acid salt or a levulinic acid salt was used instead of a glyoxylic acid salt. Similar effects are also attained when a 5-aminolevulinic acid salt is used. Similar effects are also attained when a dimethylamine salt, trimethylamine salt, hydroxylamine salt, ethanolamine salt, or the like is used as an aldehyde acid salt and/or keto acid salt.

In Examples 8 to 14, similar effects are attained when a 5-aminolevulinic acid salt is used instead of a levulinic acid salt.

In Examples 22 to 27, similar effects are attained when a glyoxylic acid salt, pyruvic acid salt, or 5-aminolevulinic acid salt is used instead of a levulinic acid. Similar effects are attained when a dimethylamine salt, trimethylamine salt, or hydroxylamine salt is used as an aldehyde acid and/or keto acid salt. Further, similar effects are attained when triethylene glycol, tetraethylene glycol, diethylene glycol monoethyl ether, diethylene glycol mono-n-butyl ether, tripropylene glycol monomethyl ether, or propylene glycol monomethyl ether acetate is used as a neutral organic compound. Similar effects were attained when 5-nitroindazole was used instead of the Cu surface protective agent 1 (indazole).

In Example 9, similar effects were attained when indazole-3-carboxylic acid was used instead of indazole.

In Examples 28 to 31, similar effects are attained when levulinic acid is used instead of pyruvic acid. Similar effects are attained when 5-aminolevulinic acid is used.

In Examples 36 to 41, similar effects are attained when pyruvic acid is used instead of levulinic acid. Similar effects are attained when 5-aminolevulinic acid or α-ketoglutaric acid is used. Further, similar effects are attained when triethylene glycol, tetraethylene glycol, diethylene glycol monoethyl ether, diethylene glycol mono-n-butyl ether, tripropylene glycol monomethyl ether, or propylene glycol monomethyl ether acetate is used as a neutral organic compound.

In Examples 37 to 40, similar effects were attained when 5-nitroindazole was used instead of the Cu surface protective agent 1 (indazole).

In Examples 28 to 31 and Examples 36 to 41, similar effects were attained when a citrate was used instead of a malonate. Similar effects are attained when a diammonium hydrogen citrate salt or ammonium dihydrogen citrate salt is used.

In Examples 32 to 35, similar effects are attained when a malonate, diammonium hydrogen citrate salt, or ammonium dihydrogen citrate salt is used instead of a citrate. Similar effects are also attained when a dimethylamine salt, trimethylamine salt, triethylamine salt, triethylenetetramine salt, or the like is used as a polycarboxylic acid salt.

In Examples 42 to 53, similar effects were attained when malonic acid was used instead of trifluoroacetic acid.

In Examples 42 to 53, similar effects are attained when oxalic acid or citric acid is used instead of trifluoroacetic acid.

In Examples 42 to 53, similar effects were attained when a citrate was used instead of a malonate. Similar effects were attained when a diammonium hydrogen citrate salt or ammonium dihydrogen citrate salt was used.

In Examples 46 to 53, similar effects were attained when a methylamine salt was used as a polycarboxylic acid salt. Similar effects are also attained when an ethylamine salt, butylamine salt, dimethylamine salt, diethylamine salt, trimethylamine salt, triethylamine salt, triethylenetetramine salt, or the like is used.

In Examples 49 to 52, similar effects were attained when 5-nitroindazole was used instead of the Cu surface protective agent 1 (indazole).

In Examples 77 to 81, similar effects are attained when ammonia, methylamine, butylamine, propanediamine, triethylenetetramine, tetramethylammonium hydroxide, choline, or the like is used instead of diethylamine.

In Examples 82 to 86, similar effects are also attained when a citrate, diammonium hydrogen citrate salt, or ammonium dihydrogen citrate salt is used instead of a malonate. Similar effects are attained when a methylamine salt, ethylamine salt, propylamine salt, butylamine salt, dimethylamine salt, diethylamine salt, trimethylamine salt, triethylamine salt, tetramethylammonium hydroxide salt, choline salt, propanediamine salt, triethylenetetramine salt, or the like is used as a polycarboxylic acid salt instead of an ammonium salt.

Similar effects are attained when 3-hydroxyindazole, 3-chloro-1H-indazole, 5-aminoindazole, 5-nitroindazole, 6-nitroindazole, or indazole-3-carboxylic acid is used instead of the Cu surface protective agent 1 (indazole).

Similar effects are attained when 2-mercaptobenzimidazole, 2-mercaptobenzoxazole, or 2-thiazoline-2-thiol is used instead of the Cu surface protective agent 2 (2-mercaptobenzothiazole).

Similar effects are attained when aminopyridine or 2,4-diaminopyrimidine is used instead of the Cu surface protective agent 3 (2,4,6-triaminopyrimidine).

Similar effects are attained when a fluoride salt of methylamine, ethylamine, diethylamine, or tetramethylammonium hydroxide is used instead of the fluorine compound of Examples 1 to 94 (ammonium fluoride).

In Examples 1 to 94, increasing the concentration of each component enhances the effects obtained; however, even when the concentration is reduced by half, sufficient effects can be obtained.

Comparative Examples 1 to 13

Chemical solutions of Examples 1 to 13 were prepared according to the compositions and proportions listed in Table 12.

Table 13 shows the results of the tests using the chemical solutions of Comparative Examples 1 to 13.

TABLE 12

| | | Composition of Residue-Removing Solution | | | | | | |
|---|---|---|---|---|---|---|---|---|
| | Water | | | | Cu Surface Protective Agent | | | |
| Comp. Ex. | (% by Weight) | Compositions of Acid and Salt | | | 1 | 2 | 3 | |
| | | Acid | (% by Weight) | Base | (ppm) | (ppm) | (ppm) | pH |
| 1 | 100.0 | Oxalic Acid | 0.0001 | | 0.5 | | | 4.7 |
| 2 | 100.0 | Oxalic Acid | 0.001 | | 1 | | | 3.8 |
| 3 | 100.0 | Oxalic Acid | 0.01 | | 100 | | | 3.1 |
| 4 | 100.0 | Oxalic Acid | 0.03 | | 100 | | | 2.6 |
| 5 | 99.9 | Oxalic Acid | 0.1 | | 300 | | | 2.1 |
| 6 | 99.8 | Oxalic Acid | 0.15 | | 500 | | | 2.0 |
| 7 | 99.7 | Oxalic Acid | 0.3 | | 500 | | | 1.6 |
| 8 | 99.4 | Oxalic Acid | 0.5 | | 750 | | | 1.6 |
| 9 | 98.9 | Oxalic Acid | 1 | | 750 | | | 1.6 |
| 10 | 99.9 | Hydrogen Fluoride | 0.1 | | 3 | | | 2.0 |
| 11 | 99.9 | Hydrogen Fluoride | 0.1 | | | 2 | | 1.5 |
| 12 | 99.0 | Acetic Acid | 1.0 | | | 1 | 100 | 3.0 |
| 13 | 99.0 | Malonic Acid | 1.0 | | 3 | | | 1.7 |

TABLE 13

| | Evaluations Using the Patterned Wafers | | | | | | Evaluations Using the Blanket Films | | | |
|---|---|---|---|---|---|---|---|---|---|---|
| | Residue-Removing Performance | | | Evaluation of Via Hole Pattern Shapes (Immersion Time in the Chemical Solutions: 3 min) | | | Low-k Film (SiOC Film) | | | |
| | Cu Surface on | | | | | | Cu | | | Surface Layer Deterioration |
| Comp. Ex. | Via Hole Bottom | Via Hole Side Walls | Substrate Surface | Cu Surface Roughness | Cu Surface Cracking | Via Hole Side Walls | Oxidation XPS | Corrosion Etching Rate | Etching Rate | Change in Contact Angle |
| 1 | D | D | D | A | A | A | A | A | A | A |
| 2 | D | D | D | A | A | A | D | A | A | B |
| 3 | D | D | D | D | D | A | D | A | A | C |
| 4 | D | D | D | D | D | A | D | A | A | D |
| 5 | D | D | D | D | D | A | D | A | A | D |
| 6 | D | D | D | D | D | A | D | A | A | D |
| 7 | D | D | D | D | D | A | D | A | A | D |
| 8 | D | D | C | D | D | A | D | A | A | D |
| 9 | D | D | C | D | D | A | D | A | A | D |
| 10 | C | A | D | C | C | B | D | C | D | D |
| 11 | C | D | D | C | B | A | B | D | A | C |
| 12 | B | C | C | B | B | A | C | D | A | D |
| 13 | B | C | C | D | D | A | D | C | A | D |

Comparative Examples 14 to 25

Chemical solutions of Examples 14 to 25 were prepared according to the compositions and proportions listed in Table 14. Table 15 shows the results of the tests using the chemical solutions of Comparative Examples 14 to 25.

TABLE 14

| | Composition of Residue-Removing Solution | | | | Cu Surface Protective Agent | |
|---|---|---|---|---|---|---|
| | Water | Compositions of Acid and Salt | | | Benzotriazole | |
| Comp. Ex. | (% by Weight) | Acid | (% by Weight) | Base | (ppm) | pH |
| 14 | 100.0 | Oxalic Acid | 0.0001 | | 0.5 | 4.7 |
| 15 | 99.5 | Oxalic Acid | 0.0001 | | 5,000 | 4.7 |
| 16 | 100.0 | Oxalic Acid | 0.01 | | 0.5 | 3.1 |
| 17 | 99.5 | Oxalic Acid | 0.01 | | 5,000 | 3.1 |
| 18 | 99.0 | Oxalic Acid | 1 | | 0.5 | 1.6 |
| 19 | 98.5 | Oxalic Acid | 1 | | 5,000 | 1.6 |
| 20 | 98.2 | Glyoxylic Acid | 1.2 | Methylamine | | 6.5 |
| 21 | 98.2 | Glyoxylic Acid | 1.2 | Methylamine | 0.5 | 6.5 |
| 22 | 98.2 | Glyoxylic Acid | 1.2 | Methylamine | 3 | 6.5 |
| 23 | 98.2 | Glyoxylic Acid | 1.2 | Methylamine | 100 | 6.5 |
| 24 | 98.2 | Glyoxylic Acid | 1.2 | Methylamine | 200 | 6.5 |
| 25 | 97.7 | Glyoxylic Acid | 1.2 | Methylamine | 5,000 | 6.5 |

TABLE 15

| | Evaluations Using the Patterned Wafers | | | | | | Evaluations Using the Blanket Films | | | |
|---|---|---|---|---|---|---|---|---|---|---|
| | Residue-Removing Performance | | | Evaluation of Via Hole Pattern Shapes (Immersion Time in the Chemical Solutions: 3 min) | | | Low-k Film (SiOC Film) | | | |
| | Cu Surface on | | | | | | Cu | | | Surface Layer Deterioration |
| Comp. Ex. | Via Hole Bottom | Via Hole Side Walls | Substrate Surface | Cu Surface Roughness | Cu Surface Cracking | Via Hole Side Walls | Oxidation XPS | Corrosion Etching Rate | Etching Rate | Change in Contact Angle |
| 14 | D | D | D | C | C | A | A | A | A | A |
| 15 | D | D | D | A | A | A | A | A | A | A |
| 16 | D | D | D | D | D | A | D | A | A | C |
| 17 | D | D | D | B | B | A | B | A | A | C |
| 18 | A | A | B | D | D | A | D | A | A | D |
| 19 | D | D | D | C | C | A | C | A | A | D |
| 20 | A | A | A | C | C | A | D | A | A | A |
| 21 | A | A | A | C | C | A | D | A | A | A |

TABLE 15-continued

| | Evaluations Using the Patterned Wafers | | | | | | Evaluations Using the Blanket Films | | | |
| | Residue-Removing Performance | | | Evaluation of Via Hole Pattern Shapes (Immersion Time in the Chemical Solutions: 3 min) | | | Cu | | | Low-k Film (SiOC Film) Surface Layer Deterioration |
| Comp. Ex. | Cu Surface on Via Hole Bottom | Via Hole Side Walls | Substrate Surface | Cu Surface Roughness | Cu Surface Cracking | Via Hole Side Walls | Oxidation XPS | Corrosion Etching | Etching Rate | Change in Contact Angle |
|---|---|---|---|---|---|---|---|---|---|---|
| 22 | A | A | A | C | C | A | D | A | A | A |
| 23 | C | C | C | C | C | A | C | A | A | A |
| 24 | D | D | D | C | C | A | B | A | A | A |
| 25 | D | D | D | A | A | A | A | A | A | A |

The chemical solutions of Comparative Examples 1 to 9 and Comparative Examples 14 to 19 have the compositions of cleaning solutions after chemical-mechanical polishing (CMP) disclosed in Patent Document 1 (Japanese Unexamined Patent Publication No. 2001-148385). Patent Document 1 teaches examples in which Cu oxidation was prevented by adding benzotriazole, indazole, or the like to an aqueous solution of a carboxylic acid compound such as oxalic acid. Patent Document 1 teaches that these chemical solutions are used to remove metals, particles used for polishing, etc., metal ions, and the like on Cu substrate surfaces.

The evaluation results above reveal that the chemical solutions of Comparative Example 1 to 9 and Comparative Examples 14 to 19 cannot be used as the residue-removing solutions for use after a dry process that exhibit the effects of the invention.

The invention claimed is:

1. A residue-removing solution for removing residues present on semiconductor substrates after dry etching and/or ashing, the residue-removing solution comprising:
   a Cu surface protective agent comprising at least one compound selected from the group consisting of:
   (1) indazoles;
   (2) at least one member selected from the group consisting of mercaptoimidazoles, mercaptooxazoles, mercaptothiazoles, mercaptobenzimidazoles, and mercaptobenzoxazoles; and
   (3) at least one member selected from the group consisting of pyrimidines, pyridazines, quinazolines, quinoxalines, and cinnolines;
   a compound capable of forming a complex or chelate with Cu being at least one member selected from the group consisting of keto acids; keto acid salts formed from keto acids and hydroxylamine, primary, secondary, or tertiary amines, quaternary ammonium, or polyamines; aldehyde acid salts formed from glyoxylic acid and hydroxylamine, primary, secondary, or tertiary amines, quaternary ammonium, or polyamines; polycarboxylic acid salts formed from malonic acid, succinic acid, glutaric acid, adipic acid, or malic acid, and hydroxylamine, alkanolamines, primary, secondary, or tertiary amines, quaternary ammonium, or polyamines; monochloroacetic acid, dichloroacetic acid, trichloroacetic acid, α-chlorobutanoic acid, β-chlorobutanoic acid, γ-chlorobutanoic acid, monofluoroacetic acid, difluoroacetic acid, trifluoroacetic acid, hydrobromic acid, perchloric acid, sulfuric acid, or malonic acid; a neutral organic solvent having an oxygen atom capable of coordinating to Cu; and monohydric alcohol with 4 or more carbon atoms; and
   water; and
   the residue-removing solution having a pH of 4 to 7.

2. The residue-removing solution according to claim 1, wherein:
   Compound (1) is selected from indazole, 3-hydroxyindazole, 3-chloro-1H-indazole, 5-aminoindazole, 5-nitroindazole, 6-aminoindazole, 6-nitroindazole, 3-bromo-7-nitroindazole, 7-nitroindazole, indazole-3-carboxylic acid, and 1-benzyl-1H-indazole 3ol;
   Compound (2) is selected from 2-mercaptobenzimidazole, 2-mercaptoimidazole, 2-mercaptooxazole, 2-mercaptobenzoxazole, and 2-mercaptothiazole, and
   Compound (3) is selected from 2,4-diaminopyrimidine, 2,4,6-triaminopyrimidine, and pyridazine.

3. The residue-removing solution according to claim 1, wherein the Cu surface protective agent comprises two or more compounds selected from the group consisting of Compounds (1) to (3).

4. The residue-removing solution according to claim 1, wherein the content of the Cu surface protective agent in the residue-removing solution is 0.1 to 4,000 ppm.

5. The residue-removing solution according to claim 1, wherein:
   the content of the Cu surface protective agent comprising Compound (1) in the residue-removing solution is 0.1 to 3,000 ppm; and/or
   the content of the Cu surface protective agent comprising Compound (2) is 0.1 to 5 ppm; and/or
   the content of the Cu surface protective agent comprising Compound (3) is 10 to 1,000 ppm.

6. The residue-removing solution according to claim 1, wherein the compound capable of forming a complex or chelate with Cu is at least one compound selected from the group consisting of keto acids, keto acid salts formed from keto acids and hydroxylamine, primary, secondary, or tertiary amines, quaternary ammonium, or polyamines; and aldehyde acid salts formed from glyoxylic acid and hydroxylamine, primary, secondary, or tertiary amines, quaternary ammonium, or polyamines.

7. The residue-removing solution according to claim 1, wherein the compound capable of forming a complex or chelate with Cu is at least one member selected from the group consisting of monochloroacetic acid, dichloroacetic acid, trichloroacetic acid, α-chlorobutanoic acid, β-chlorobutanoic acid, γ-chlorobutanoic acid, monofluoroacetic acid, difluoroacetic acid, trifluoroacetic acid, hydrobromic acid, perchloric acid, sulfuric acid, malonic acid; and polycarboxylic acid salts formed from malonic acid, succinic acid, glutaric acid, adipic acid, or malic acid, and hydroxylamine, alkanolamines, primary, secondary, or tertiary amines, quaternary ammonium, or polyamines.

8. The residue-removing solution according to claim 1, wherein the compound capable of forming a complex or chelate with Cu is a neutral organic compound having two or more oxygen atoms capable of coordinating to Cu and/or a monohydric alcohol with 4 or more carbon atoms.

9. The residue-removing solution according to claim 1, wherein the compound capable of forming a complex or chelate with Cu is a perchlorate.

10. The residue-removing solution according to claim 1, further comprising a fluorine compound.

11. The residue-removing solution according to claim 1, further comprising a surfactant.

12. A method for removing residues present on semiconductor substrates after dry etching and/or ashing, the method comprising bringing a semiconductor substrate after dry etching and/or ashing into contact with the residue-removing solution of claim 1.

13. The method according to claim 12, wherein the semiconductor substrate has Cu as an interconnect material, and a low-k film as an interlayer dielectric material.

14. A method for manufacturing semiconductor devices comprising the steps of:
   (1) subjecting a semiconductor substrate having Cu as an interconnect material, and a low-k film as an interlayer dielectric material, to dry etching and/or ashing; and
   (2) bringing the semiconductor substrate processed in Step (1) into contact with the residue-removing solution of claim 1.

15. The method according to claim 14, further comprising the step of (3) heating the semiconductor substrate processed in Step (2) to 180° C. or more in an inert gas or vacuum.

16. The residue-removing solution according to claim 1, wherein the residue-removing solution has a pH of 4 to 6.5.

* * * * *